(12) United States Patent
Liaw

(10) Patent No.: US 10,727,238 B2
(45) Date of Patent: Jul. 28, 2020

(54) INTEGRATED CIRCUIT CHIP AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/396,292

(22) Filed: Apr. 26, 2019

(65) Prior Publication Data
US 2019/0259765 A1 Aug. 22, 2019

Related U.S. Application Data

(62) Division of application No. 15/799,464, filed on Oct. 31, 2017, now Pat. No. 10,276,581.

(51) Int. Cl.
| | |
|---|---|
| *G11C 11/419* | (2006.01) |
| *H01L 27/11* | (2006.01) |
| *H01L 29/423* | (2006.01) |
| *H01L 27/02* | (2006.01) |
| *H01L 27/092* | (2006.01) |

(Continued)

(52) U.S. Cl.
CPC ........ *H01L 27/1104* (2013.01); *G11C 11/419* (2013.01); *H01L 21/32133* (2013.01); *H01L 21/82385* (2013.01); *H01L 21/823821* (2013.01); *H01L 21/823842* (2013.01); *H01L 21/823871* (2013.01); *H01L 27/0207* (2013.01); *H01L 27/0922* (2013.01); *H01L 27/0924* (2013.01); *H01L 29/161* (2013.01); *H01L 29/42372* (2013.01); *H01L 29/495* (2013.01); *H01L 29/4966* (2013.01); *G11C 11/412* (2013.01); *H01L 21/823807* (2013.01); *H01L 27/0928* (2013.01)

(58) Field of Classification Search
CPC ............................... G11C 11/161; G11C 7/12
USPC .................................................. 365/156, 158
See application file for complete search history.

(56) References Cited

U.S. PATENT DOCUMENTS

| 5,663,662 A | 9/1997 | Kurosawa | |
|---|---|---|---|
| 7,514,757 B2 * | 4/2009 | Liaw | ............... H01L 27/105 257/393 |

(Continued)

OTHER PUBLICATIONS

Z. Zhou, Y. Z. Huang, L. Wang, and T. N. Tan. Exploring generalized shape analysis by topological representations. Pattern Recognition Letters, 87:177-185, 2017.

(Continued)

*Primary Examiner* — Michael T Tran
(74) *Attorney, Agent, or Firm* — Maschoff Brennan

(57) ABSTRACT

A method of manufacturing an integrated circuit chip includes doping a substrate with a p-type dopant to form a first p-well region in a first memory cell and a second p-well region in a second memory cell; forming first and second semiconductor fins over the first and second p-well regions, respectively; forming a first work function layer over the first semiconductor fin; forming a second work function layer over the second semiconductor fin and having a thickness different from a thickness of the first work function layer; and forming a metal fill layer over the first and second work function layers.

20 Claims, 11 Drawing Sheets

(51) Int. Cl.
*H01L 29/161* (2006.01)
*H01L 29/49* (2006.01)
*H01L 21/8238* (2006.01)
*H01L 21/3213* (2006.01)
*G11C 11/412* (2006.01)

(56) References Cited

U.S. PATENT DOCUMENTS

| | | | |
|---|---|---|---|
| 9,576,644 B2 | 2/2017 | Liaw | |
| 9,741,869 B1* | 8/2017 | Mihara | H01L 29/66833 |
| 10,157,748 B2* | 12/2018 | Fung | H01L 21/3065 |
| 2005/0285212 A1* | 12/2005 | Tolchinsky | H01L 29/1054 |
| | | | 257/408 |
| 2008/0225590 A1* | 9/2008 | Lamorey | G11C 11/16 |
| | | | 365/185.05 |
| 2010/0201376 A1* | 8/2010 | Ouyang | G11C 29/50 |
| | | | 324/551 |
| 2010/0208506 A1* | 8/2010 | Rana | G11C 17/12 |
| | | | 365/104 |
| 2010/0220542 A1* | 9/2010 | Chen | G11C 11/419 |
| | | | 365/230.01 |
| 2010/0238728 A1* | 9/2010 | Leung | G11C 11/404 |
| | | | 365/185.08 |
| 2010/0246293 A1* | 9/2010 | Dudeck | G11C 7/04 |
| | | | 365/194 |
| 2010/0281446 A1 | 11/2010 | Hou et al. | |
| 2011/0142008 A1 | 6/2011 | Choi | |
| 2011/0186985 A1* | 8/2011 | Sasaki | H01L 23/28 |
| | | | 257/737 |
| 2012/0085385 A1 | 4/2012 | Keysar et al. | |
| 2013/0235809 A1 | 9/2013 | Li et al. | |
| 2014/0167120 A1* | 6/2014 | Chi | H01L 27/0886 |
| | | | 257/288 |
| 2014/0269111 A1 | 9/2014 | He | |
| 2014/0328128 A1* | 11/2014 | Louie | H01L 21/26586 |
| | | | 365/185.17 |
| 2015/0179503 A1* | 6/2015 | Tsai | H01L 21/76224 |
| | | | 257/347 |
| 2015/0255166 A1 | 9/2015 | Tseng et al. | |
| 2015/0332771 A1* | 11/2015 | Kwon | H01L 27/1157 |
| | | | 365/185.11 |
| 2015/0380078 A1 | 12/2015 | Liaw | |
| 2015/0380555 A1* | 12/2015 | Ohtou | H01L 29/7849 |
| | | | 257/329 |
| 2016/0027644 A1* | 1/2016 | Tsai | H01L 21/02576 |
| | | | 257/408 |
| 2016/0095109 A1 | 3/2016 | Scott et al. | |
| 2018/0033797 A1* | 2/2018 | Colinge | H01L 29/42332 |
| 2018/0117413 A1 | 5/2018 | Meetin | |
| 2018/0117442 A1 | 5/2018 | Meetin | |
| 2018/0122812 A1* | 5/2018 | Liaw | H01L 23/528 |
| 2018/0174854 A1* | 6/2018 | Tseng | H01L 21/3086 |
| 2018/0317070 A1 | 11/2018 | Li et al. | |
| 2018/0376373 A1 | 12/2018 | Liao et al. | |

OTHER PUBLICATIONS

M. Zeppelzauer, B. Zielin'ski, M. Juda, and M. Seidl. A study on topological descriptors for the analysis of 3d surface texture. Computer Vision and Image Understanding, 167:74-88, 2018.

B. Wang, B. Summa, V. Pascucci, and M. Vejdemo-Johansson. Branching and circular features in high dimensional data. IEEE Transactions on Visualization and Computer Graphics, 17:1902-1911, 2011.

D. Pachauri, C. Hinrichs, M.K. Chung, S.C. Johnson, and V. Singh. Topology-based kernels with application to inference problems in alzheimer's disease. Medical Imaging, IEEE Transactions on, 30(10):1760-1770, Oct. 2011b. ISSN 0278-0062. doi: 10.1109/TMI.2011.2147327.

D. D. Nguyen, Z. X. Cang, K. D. Wu, M. L. Wang, Y. Cao, and G. W. Wei. Mathematical deep learning for pose and binding affinity prediction and ranking in D3R Grand Challenges. arXiv preprint arXiv:1804.10647, 2018.

C,. Li, M. Ovsjanikov, and F. Chazal. Persistence-based structural recognition. In Proceedings of the IEEE Conference on Computer Vision and Pattern Recognition, pp. 1995-2002, 2014.

X. J. Zhu. Persistent homology: An introduction and a new text representation for natural language processing. In IJCAI, pp. 1953-1959, 2013.

L. M. Seversky, S. Davis, and M. Berger. On time-series topological data analysis: New data and opportunities. In Proceedings of the IEEE Conference on Computer Vision and Pattern Recognition Workshops, pp. 59-67, 2016.

Y. Umeda. Time series classification via topological data analysis. Information and Media Technologies, 12:228-239, 2017.

* cited by examiner

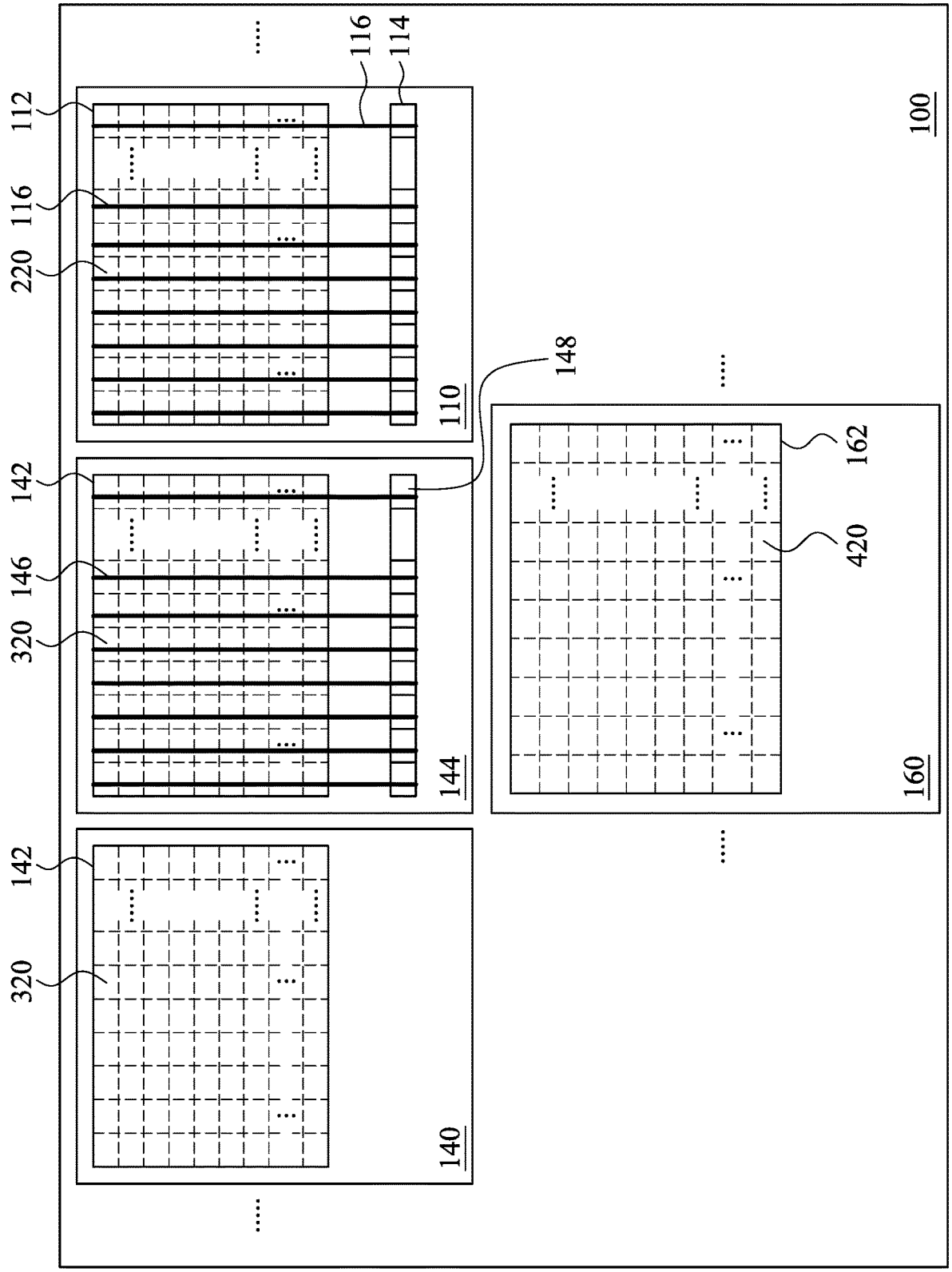

1000 forming pass gate devices, pull down devices, and pull up devices over a substrate for a first type memory device, wherein each pull down device of the first type memory device comprises a gate electrode including a work function layer having a first thickness ~1012 forming pass gate devices, pull down devices, and pull up devices over the substrate for a second type memory device, wherein each pull down device of the second type memory device comprises a gate electrode including a work function layer having a second thickness, wherein the first type memory cell and the second type memory cell substantially have the same cell size, and the first thickness is thicker than the second thickness ~1014 forming pass gate devices, pull down devices, and pull up devices for a third type memory device, wherein the third type memory cell has a cell size larger than that of the first or second type memory cell ~1016

Fig. 7

INTEGRATED CIRCUIT CHIP AND MANUFACTURING METHOD THEREOF

PRIORITY CLAIM AND CROSS-REFERENCE

The present application is a Divisional Application of the U.S. application Ser. No. 15/799,464, filed Oct. 31, 2017, now U.S. Pat. No. 10,276,581, issued Apr. 30, 2019, all of which are herein incorporated by reference in their entireties.

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. In some applications in an IC chip, a plurality of SRAM devices are implemented based on different design criteria. For example, at least one SRAM device of the plurality of SRAM devices is designed to have faster data access than all other SRAM device(s) of the plurality of SRAM devices; and at least one SRAM device of the plurality of SRAM devices is designed to occupy less area per stored bit than all other SRAM device(s) of the plurality of SRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is block diagram of an integrated circuit (IC) chip having three type of static random access memory (SRAM) devices, in accordance with some embodiments.

FIG. 7 is a flowchart of a method of forming memory devices in accordance with some embodiments.

DETAILED DESCRIPTION

Figure 2A:
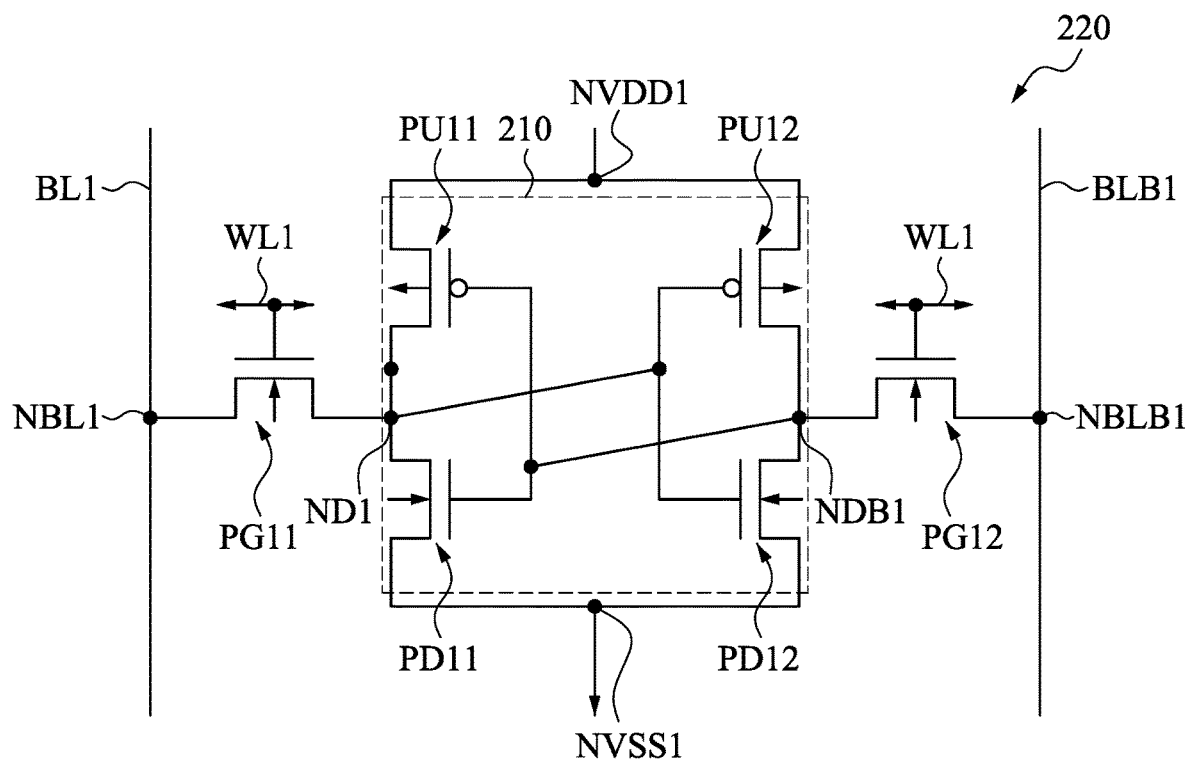
FIGS. 2A and 2B are schematic circuit diagrams of a first type memory cell and a second type memory cell respectively in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The electronics industry has an ever growing desire for increased memory capacity with reduced power consumption and cost per bit of memory. One way that the cost per bit is reduced is by decreasing the size of the features that make up a semiconductor chip by a process known as "scaling." The high density of the memory chips, however, induces problems. For example, in deep sub-micron SRAM design, due to process variations, cell mismatch issues arise. As such, the following paragraphs provide memory devices and manufacturing method thereof to improve the cell performance when the cell density is increased.

FIG. 1 is a block diagram of an IC chip 100 having memory devices 110, 140, 144, and 160, in accordance with some embodiments. Other devices and components of the IC chip 100 are not depicted in FIG. 1. In some embodiments, the memory devices 110, 140, 144, and 160 are SRAM devices formed of SRAM memory cells. For clarity, some details of the memory devices 110, 140, 144, and 160 are not depicted in FIG. 1.

The memory device 110 includes a memory cell array 112, a plurality of write assist circuits 114, and a plurality of conductive lines 116 electrically coupling memory cell array 112 with the write assist circuits 114. The memory cell array 112 includes a plurality of first type memory cells 220 arranged into rows along a direction X and columns along a direction Y. Each column of the columns of the first type memory cells 220 of memory cell array 112 has at least one conductive line of the plurality of conductive lines 116 extending along the direction Y and electrically coupling the column and a corresponding one of the write assist circuits 114.

In some embodiments, the conductive lines 116 are bit lines of the memory device 110, and each of the write assist circuits 114 is configured to set a voltage level of the corresponding bit line of the memory device 110 to be less than a ground reference level. In some embodiments, the conductive lines 116 are bit lines of the memory device 110, and each of the write assist circuits 114 are supply voltage lines of the memory device 110, and each of the write assist circuits 114 is configured to set a voltage level of the corresponding supply voltage line of the memory device 110 to be less than a supply voltage level.

Each one of the memory devices 140 and 144 includes a memory cell array 142. The memory cell array 142 includes a plurality of second type memory cells 320 arranged into rows along the direction X and columns along the direction Y. In addition, the memory device 144 further includes a plurality of write assist circuits 148, and a plurality of conductive lines 146 electrically coupling the memory cell array 142 with the write assist circuits 148. For the memory device 144, each one of the columns of the first type memory cells 220 of the memory cell array 144 has at least one of the conductive lines 146 extending along the direction Y and electrically coupling the column and a corresponding one of the write assist circuits 148.

In some embodiments, the plurality of conductive lines 146 are bit lines of the memory device 144, and each one of the write assist circuits 148 is configured to set a voltage level of the corresponding bit line of the memory device 144 to be less than a ground reference level. In some embodiments, the conductive lines 146 are bit lines of the memory device 144, and each one of the write assist circuits 148 are supply voltage lines of the memory device 144, and each one of the write assist circuits 148 is configured to set a voltage level of the corresponding supply voltage line of the memory device 144 to be less than a supply voltage level. On the other hand, the memory device 140 is free from having a write assist circuit.

In addition, each one of the memory devices 160 includes a memory cell array 162. The memory cell array 162 includes a plurality of third type memory cells 420 arranged into rows along the direction X and columns along the direction Y. The memory device 160 is free from having a counterpart circuit of a write assist circuit.

In some embodiments, the first type memory cell 220 used to implement the memory device 110 occupies an area substantially equals to that of a second type memory cell 320 used to implement the memory devices 140 and 144. In some embodiments, the occupied area of the first type memory cell 220 and the occupied area of the second type memory cell 320 have substantially the same size and shape. In some embodiments, a third type memory cell 420 used to implement the memory device 160 occupies an area are substantially larger than that of the first type memory cell 220 used to implement the memory device 110, and larger than that of the second type memory cell 320 used to implement the memory device 140 or 144. The term "substantially" as used herein may be applied to modify any quantitative representation which could permissibly vary without resulting in a change in the basic function to which it is related.

Further details regarding the first type memory cell 220 are described in conjunction with FIGS. 2A, 3A, 4A, and 5A. Further details regarding the second type memory cell 320 are described in conjunction with FIGS. 2B, 3B, 4B, and 5B.

Figure 2B:
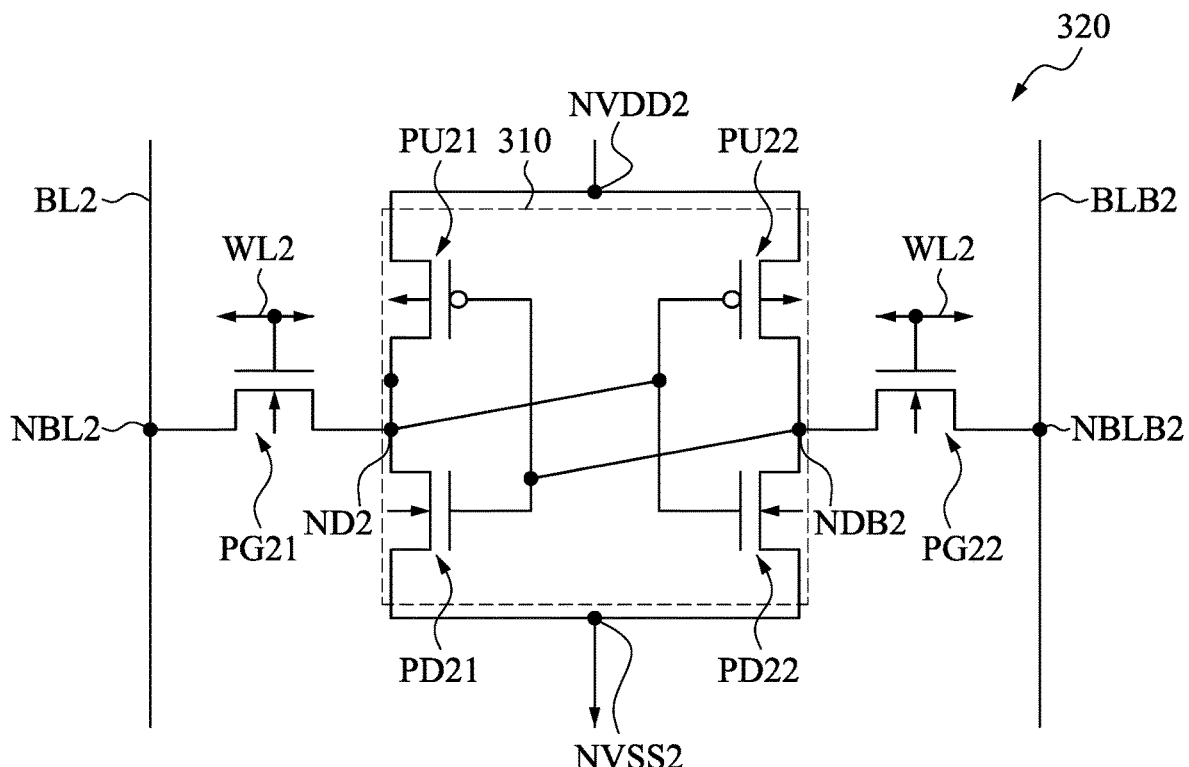

FIGS. 2A and 2B are schematic circuit diagrams of the first type memory cell 220 and the second type memory cell 320 respectively, in accordance with some embodiments. The first type memory cell 220 includes a storage circuit 210 having data nodes ND1 and NDB1, two pass gate devices PG11 and PG12, a supply voltage node NVDD1, a reference voltage node NVSS1, a first bit line BL1, a second bit line BLB1, and a word line WL1. The pass gate device PG11 is electrically coupled with the data node ND1, the bit line BL1, and the word line WL1. The pass gate device PG12 is electrically coupled with the data node NDB1, the bit line BLB1, and the word line WL1.

The pass gate devices PG11 and PG12 can be N-type metal oxide semiconductor (NMOS) transistors. A drain of the pass gate device PG11 is electrically coupled with the bit line BL1 at the node NBL1. A source of the pass gate device PG11 is electrically coupled with the data node ND1. A drain of the pass gate device PG12 is electrically coupled with the bit line BLB1 at the node NBLB1. A source of the pass gate device PG12 is electrically coupled with the data node NDB1. A gate of the pass gate device PG11 and a gate of the pass gate device PG12 are electrically coupled with the word line WL1. The gates of the pass gate devices PG11 and PG12 are control terminals thereof configured to receive a control signal for turning on or off the pass gate devices PG11 and PG12.

The storage circuit 210 includes two pull up devices PU11 and PU12 and two pull down devices PD11 and PD12. The two pull up devices PU11 and PU12 can be P-type metal oxide semiconductor (PMOS) transistors, and the two pull down devices PD11 and PD12 can be N-type metal oxide semiconductor (NMOS) transistors. The pull up devices PU11 and PU12 and the pull down devices PD11 and PD12 form a cross latch having two cross-coupled inverters. The pull up device PU11 and pull down device PD11 form a first inverter while the pull up device PU12 and pull down device PD12 form a second inverter. Drains of the pull up device PU11 and the pull down device PD11 are coupled together and form the data node ND1. Drains of the pull up device PU12 and the pull down device PD12 are coupled together and form the data node NDB1. Gates of the pull up device PU11 and the pull down device PD11 are coupled together and to the drains of the pull up device PU12 and the pull down device PD12. Gates of the pull up device PU12 and the pull down device PD12 are coupled together and to the drains of the pull up device PU11 and the pull down device PD11. Sources of the pull up devices PU11 and PU12 are coupled with the supply voltage node NVDD1. In some embodiments, the supply voltage node NVDD1 is configured to receive a supply voltage VDD1. The sources of the pull down devices PD11 and PD12 are coupled with the reference voltage node NVSS1. In some embodiments, the reference voltage node NVSS1 is configured to receive a ground reference voltage VSS1.

In some embodiments, in a memory array, such as the memory cell array 112 of FIG. 1, having a plurality of memory cells each having a circuit schematic illustration the same as the first type memory cell 220, the bit lines BL1 and BLB1 are coupled to each drain of the pass gate devices PG11 and PG12 of memory cells in a column of the memory array, and the word line WL1 is coupled to each gate of the pass gate devices PG11 and PG12 of memory cells in a row of the memory array. In some embodiments, each of the pass gate devices PG11 and PG12 has a first threshold voltage Vt1, and each of the pull up devices PU11 and PU12 has a second threshold voltage Vt2.

The first type memory cell 220 can be a single port SRAM cell illustrated as an example. In some embodiments, the present application is applicable to a multiple-port SRAM cell having one or more write ports and/or one or more read ports.

In FIG. 2B, the second type memory cell 320 includes a storage circuit 310 having data nodes ND2 and NDB2, two pass gate devices PG21 and PG22, a supply voltage node NVDD2, a reference voltage node NVSS2, a first bit line BL2, a second bit line BLB2, and a word line WL2. The pass gate device PG21 is electrically coupled with the data node ND2, the bit line BL2, and the word line WL2. The pass gate device PG22 is electrically coupled with the data node NDB2, the bit line BLB2, and the word line WL2.

The storage circuit 310 includes two pull up P-type metal oxide semiconductor (PMOS) transistors PU21 and PU22 and two pull down N-type metal oxide semiconductor (NMOS) transistors PD21 and PD22. The pull up devices PU21 and PU22 and the pull down devices PD21 and PD22 form a cross latch having two cross-coupled inverters. The transistors PU21 and PD21 form a first inverter while the pull up device PU22 and the pull down device PD22 form a second inverter. Drains of the pull up device PU21 and PD21 are coupled together and form the data node ND2. Drains of the pull up device PU22 and the pull down device PD22 are coupled together and form the data node NDB2. Gates of the pull up device PU21 and the pull down device PD21 are coupled together and to the drains of the pull up device PU22 and the pull down device PD22. Gates of the pull up device PU22 and the pull down device PD22 are coupled together and to the drains of pull up device PU21 and the pull down device PD21. Sources of the pull up devices PU21 and PU22 are coupled with the supply voltage node NVDD2. In some embodiments, the supply voltage node NVDD2 is configured to receive a supply voltage VDD2. The sources of the pull down devices PD21 and PD22 are coupled with the reference voltage node NVSS2. In some embodiments, the reference voltage node NVSS2 is configured to receive a ground reference voltage VSS2.

The pass gate devices PG21 and PG22 can be N-type transistors. A drain of the pass gate device PG21 is electrically coupled with the bit line BL2 at the node NBL2. A source of the pass gate device PG21 is electrically coupled with the data node ND2. A drain of the pass gate device PG22 is electrically coupled with the bit line BLB2 at the node NBLB2. A source of the pass gate device PG22 is electrically coupled with the data node NDB2. A gate of the pass gate device PG21 and a gate of the pass gate device PG22 are electrically coupled with the word line WL2. The gates of the pass gate devices PG21 and PG22 are control terminals thereof configured to receive a control signal for turning on or off the pass gate devices PG21 and PG22.

In some embodiments, in a memory array, such as the memory cell array 142 of FIG. 1, having a plurality of memory cells 320 each having a circuit schematic illustration the same as the second type memory cell 320, the bit lines BL2 and BLB2 are coupled to each drain of the pass gate devices PG21 and PG22 of memory cells in a column of the memory array, and the word line WL2 is coupled to each gate of the pass gate devices PG21 and PG22 of memory cells in a row of the memory array. In some embodiments, each of the pass gate devices PG21 and PG22 has a third threshold voltage Vt3 lower than the first threshold voltage Vt1 of the pass gate devices PG11 and PG12 of the first type memory cell 220 at least about 40 mV, and each of the pull up devices PU21 and PU22 has a fourth threshold voltage Vt4 lower than the second threshold voltage Vt2 of the pass gate devices PG11 and PG12 of the first type memory cell 220 at least about 40 mV.

The first type memory cell 220 and the second type memory cell 320 are respectively single port SRAM cells illustrated as examples. In some embodiments, the present application is applicable to a multiple-port SRAM cell having one or more write ports and/or one or more read ports.

Figure 3A:
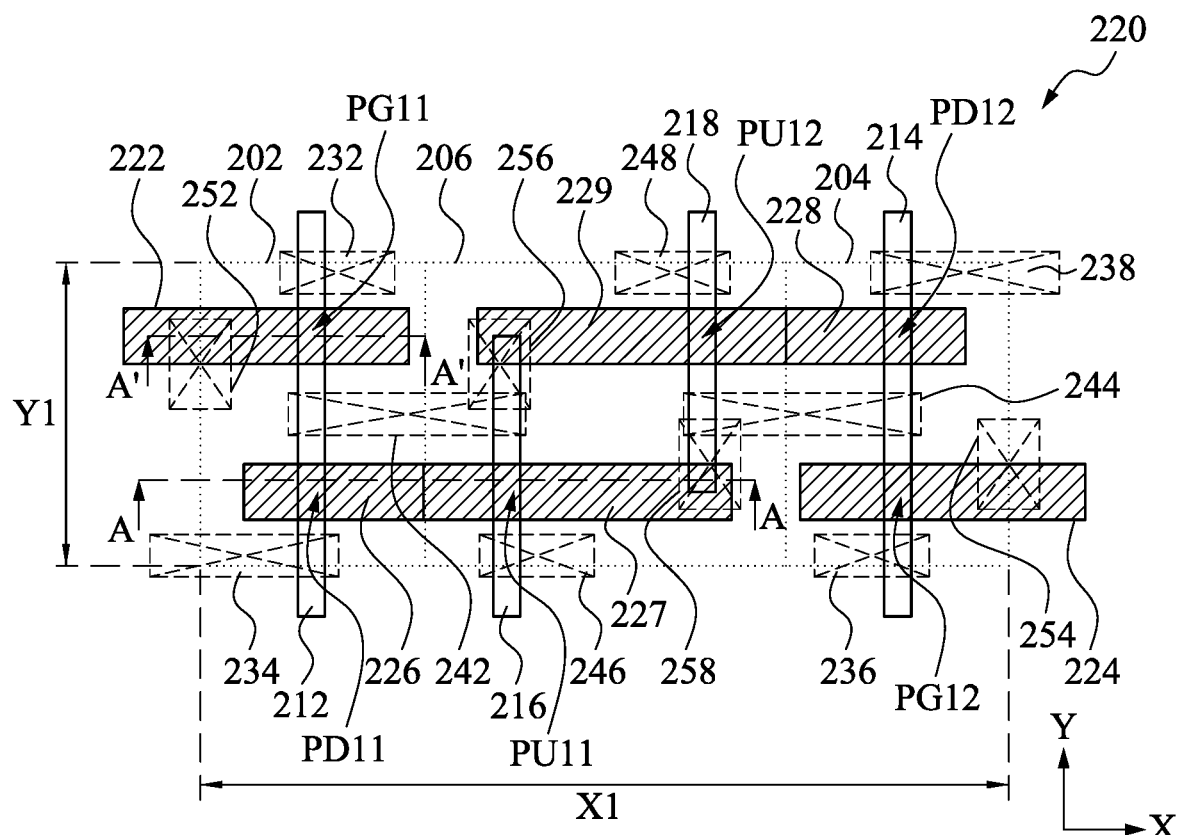
FIGS. 3A and 3B are top views of the first type memory cell and the second type memory cell respectively, with all the depictions regarding components at and over a first metal layer of a chip omitted, in accordance with some embodiments.
Figure 3B:
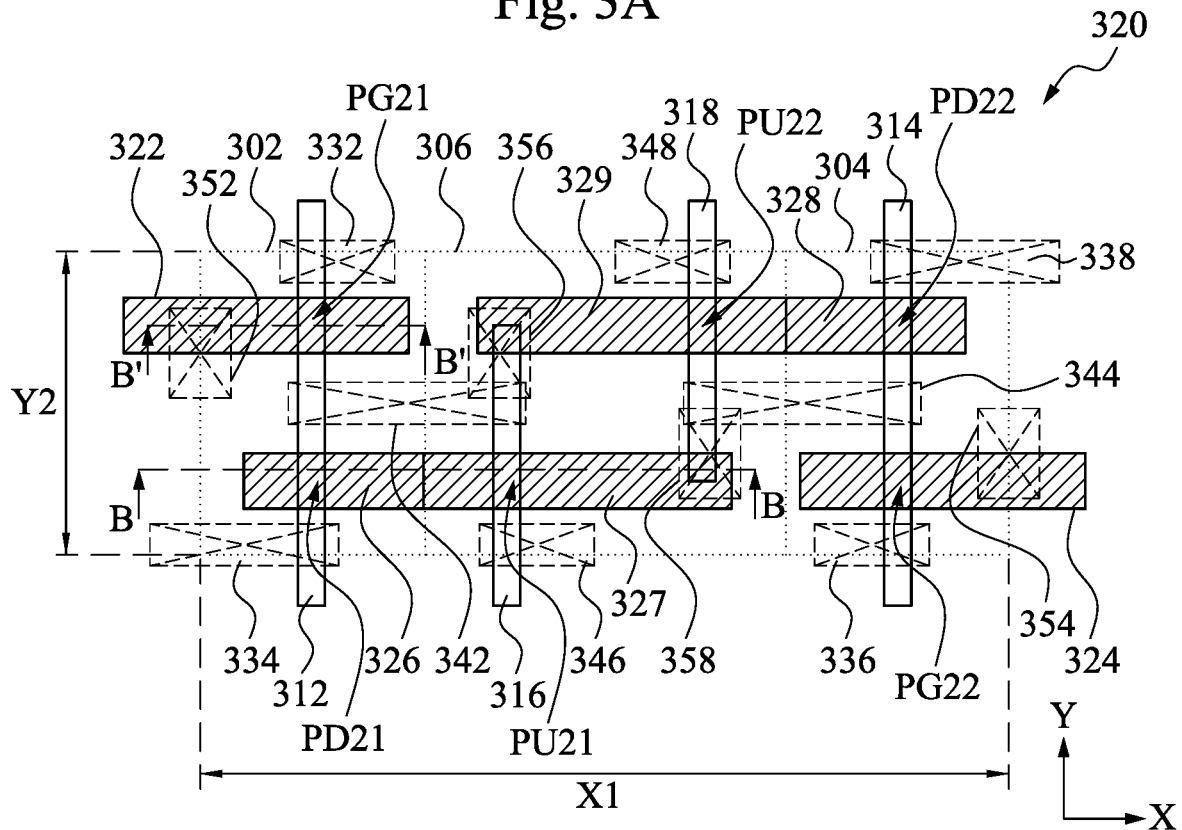

FIGS. 3A and 3B are top views of a first type memory cell 220 and a second type memory cell 320 respectively, with all the depictions regarding components at and over a first metal layer of a chip omitted, in accordance with some embodiments. Moreover, the depictions regarding via plugs connecting various components depicted in FIGS. 3A and 3B and the first metal layer are omitted. In some embodiments, the first type memory cell 220 is an implementation in FIG. 1 having a circuit schematic illustration depicted in FIG. 2A. In addition, the second type memory cell 320 is an implementation in FIG. 1 having a circuit schematic illustration depicted in FIG. 2B. Some components of the first type memory cell 220 and the second type memory cell 320 are not shown in FIGS. 3A and 3B for clarity of FIGS. 3A and 3B.

As shown in FIG. 3A, the memory cell 220 includes a substrate 201 (shown in FIG. 4A) having P-well regions 202 and 204 and an N-well region 206 between the P-well regions 202 and 204. The memory cell 220 includes a plurality of active structures 212, 214, 216, and 218 extending along the direction Y, a plurality of gate structures 222, 224, 226, 227, 228, and 229 extending along the direction X, a plurality of active contact structures 232, 234, 236, 238, 242, 244, 246, and 248, and a plurality of gate contact structures 252, 254, 256, and 258.

The active structures 212 and 214 are respectively in the P-well regions 202 and 204 for forming N-type transistors, such as NMOS transistors. The active structures 216 and 218 are in the N-well region 206 forming P-type transistors, such as PMOS transistors. The active structures 212, 214, 216, and 218 are semiconductor fins formed on the substrate 201. The number of fins for each transistor depicted in FIG. 3A is provided as an example. In some embodiments, any number of fins is within the scope of various embodiments. In some embodiments, the active structures 212, 214, 216, and 218 are integrally formed with the substrate 201.

The gate structure 226 overlaps the active structure 212 and functions as a gate of the pull down device PD11. That is, the active structure 212 and the gate structure 226 form the pull down device PD11. The active contact structures 234 and 242 overlap the active structure 212 and correspond to a source contact and a drain contact of the pull down device PD11. The gate structure 227 overlaps the active structure 216 and functions as a gate of the pull up device PU11. That is, the active structure 216 and the gate structure 227 form the pull up device PU11. The active contact structures 246 and 242 overlap the active structure 216 and correspond to a source contact and a drain contact of the pull up device PU11. The gate structure 228 overlaps the active structure 214 and functions as a gate of the pull down device PD12. That is, the active structure 214 and the gate structure 228 form the pull down device PD12. The active contact structures 238 and 236 overlap the active structure 214 and correspond to a source contact and a drain contact of the pull down device PD12. The gate structure 229 overlaps the active structure 218 and functions as a gate of the pull up device PU12. That is, the active structure 218 and the gate structure 229 form the pull up device PU12. The active contact structures 248 and 244 overlap the active structure 218 and correspond to a source contact and a drain contact of the pull up device PU12. The gate contact structure 256 connects the gate structure 229 and the active contact structures 242 to electrically interconnect the gate structure 229 and the active structures 212 and 216. The gate contact structure 258 connects the gate structure 227 and the active contact structures 244 to electrically interconnect the gate structure 227 and the active structures 214 and 218. Accordingly, the active contact structures 246 and 248 correspond to the node NVDD1 shown in FIG. 2A, and the active contact structures 234 and 238 correspond to the reference voltage node NVSS1 shown in FIG. 2A.

The gate structure 222 overlaps the active structure 212 and functions as a gate of the pass gate device PG11. That is, the active structure 212 and the gate structure 222 form the pass gate device PG11. The active contact structures 232 and 242 overlap the active structure 212 and correspond to a source contact and a drain contact of the pass gate device PG11. The gate contact structure 252 contacts the gate structure 222 and functions as a landing pad for the gate structure 222 to electrically interconnect the gate structure 222 to the word line WL1 of FIG. 2A. The gate structure 224 overlaps the active structure 214 and functions as a gate of the pass gate device PG12. That is, the active structure 214 and the gate structure 224 form the pass gate device PG12. The active contact structures 236 and 244 overlap the active structure 214 and correspond to a source contact and a drain contact of the pass gate device PG12. The gate contact structure 254 contacts the gate structure 224 and functions as a landing pad for the gate structure 224 to electrically interconnect the gate structure 224 to the word line WL1 of FIG. 2A. Accordingly, the active contact structure 232 corresponds to the node NBL1, and the active contact structure 236 corresponds to the node NBLB1.

In FIG. 3A, the memory cell 220 has a cell width X1 measurable along the direction X and a cell height Y1 measurable along the direction Y. The memory cells 220 in the memory devices 110 of FIG. 1 have substantially the same cell size. In some applications, a memory macro is formed by repeating and abutting memory cells having a configuration identical or mirrored-identical to the memory cell 220, and thus cell width X1 is also referred to as a cell pitch along the direction X, and cell height Y1 is also referred to as a cell pitch along the direction Y. In some embodiments, a ratio of cell width X1 to cell height Y1 is greater than one.

As shown in FIG. 3B, the memory cell 320 includes a substrate 201 (shown in FIG. 4B) having P-well regions 302 and 304 and an N-well region 306 between the P-well regions 302 and 304. The memory cell 320 includes a plurality of active structures 312, 314, 316, and 318 extending along the direction Y, a plurality of gate structures 322, 324, 326, 327, 328, and 329 extending along the direction X, a plurality of active contact structures 332, 334, 336, 338, 342, 344, 346, and 348, and a plurality of gate contact structures 352, 354, 356, and 358.

The active structures 312 and 314 are respectively in the P-well regions 302 and 304 for forming N-type transistors, such as NMOS transistors. The active structures 316 and 318 are in the N-well region 306 forming P-type transistors, such as PMOS transistors. The active structures 312, 314, 316, and 318 are semiconductor fins formed on the substrate 201. The number of fins for each transistor depicted in FIG. 3B is provided as an example. In some embodiments, any number of fins is within the scope of various embodiments. In some embodiments, the active structures 312, 314, 316, and 318 are integrally formed with the substrate 201.

The gate structure 326 overlaps the active structure 312 and functions as a gate of the pull down device PD21. That is, the active structure 312 and the gate structure 326 form the pull down device PD21. The active contact structures 334 and 342 overlap the active structure 312 and correspond to a source contact and a drain contact of the pull down device PD21. The gate structure 327 overlaps the active structure 316 and functions as a gate of the pull up device PU21. That is, the active structure 316 and the gate structure 327 form the pull up device PU21. The active contact structures 346 and 342 overlap the active structure 316 and correspond to a source contact and a drain contact of the pull up device PU21. The gate structure 328 overlaps the active structure 314 and functions as a gate of the pull down device PD22. That is, the active structure 314 and the gate structure 328 form the pull down device PD22. The active contact structures 338 and 336 overlap the active structure 314 and correspond to a source contact and a drain contact of the pull down device PD22. The gate structure 329 overlaps the active structure 318 and functions as a gate of the pull up device PU22. That is, the active structure 318 and the gate structure 329 form the pull up device PU22. The active contact structures 348 and 344 overlap the active structure 318 and correspond to a source contact and a drain contact of the pull up device PU22. The gate contact structure 356 connects the gate structure 329 and the active contact structures 342 to electrically interconnect the gate structure 329 and the active structures 312 and 316. The gate contact structure 358 connects the gate structure 326 and the active contact structures 344 to electrically interconnect the gate structure 327 and the active structures 314 and 318. Accordingly, the active contact structures 346 and 348 correspond to the node NVDD2 shown in FIG. 2B, and the active contact structures 334 and 338 correspond to the reference voltage node NVSS shown in FIG. 2B.

The gate structure 322 overlaps the active structure 312 and functions as a gate of the pass gate device PG21. That is, the active structure 312 and the gate structure 322 form the pass gate device PG21. The active contact structures 332 and 342 overlap the active structure 312 and correspond to a source contact and a drain contact of the pass gate device PG21. The gate contact structure 352 contacts the gate structure 322 and functions as a landing pad for the gate structure 322 to electrically interconnect the gate structure 322 to the word line WL2 of FIG. 2B. The gate structure 324 overlaps the active structure 314 and functions as a gate of the pass gate device PG22. That is, the active structure 314 and the gate structure 324 form the pass gate device PG22. The active contact structures 336 and 344 overlap the active structure 314 and correspond to a source contact and a drain contact of the pass gate device PG22. The gate contact structure 354 contacts the gate structure 324 and functions as a landing pad for the gate structure 324 to electrically interconnect the gate structure 324 to the word line WL2 of FIG. 2B. Accordingly, the active contact structure 332 corresponds to the node NBL2, and the active contact structure 336 corresponds to the node NBLB2.

In FIG. 3B, the memory cell 320 has a cell width X2 measurable along the direction X and a cell height Y2 measurable along the direction Y. The memory cells 320 in the memory devices 140 and 144 of FIG. 1 have substantially the same cell size. In some embodiments, a ratio of cell width X2 to cell height Y2 is greater than one. In some embodiments, the cell width X2 of the memory cell 320 is substantially equals to the cell width X1 of the memory cell 220 shown in FIG. 3A, and the cell height Y2 of the memory cell 320 is substantially equals to the cell height Y1 of the memory cell 220. Therefore, the memory cell 320 substantially has the same size (or the same cell pitch or the same shape) as the memory cell 220.

Figure 4A:
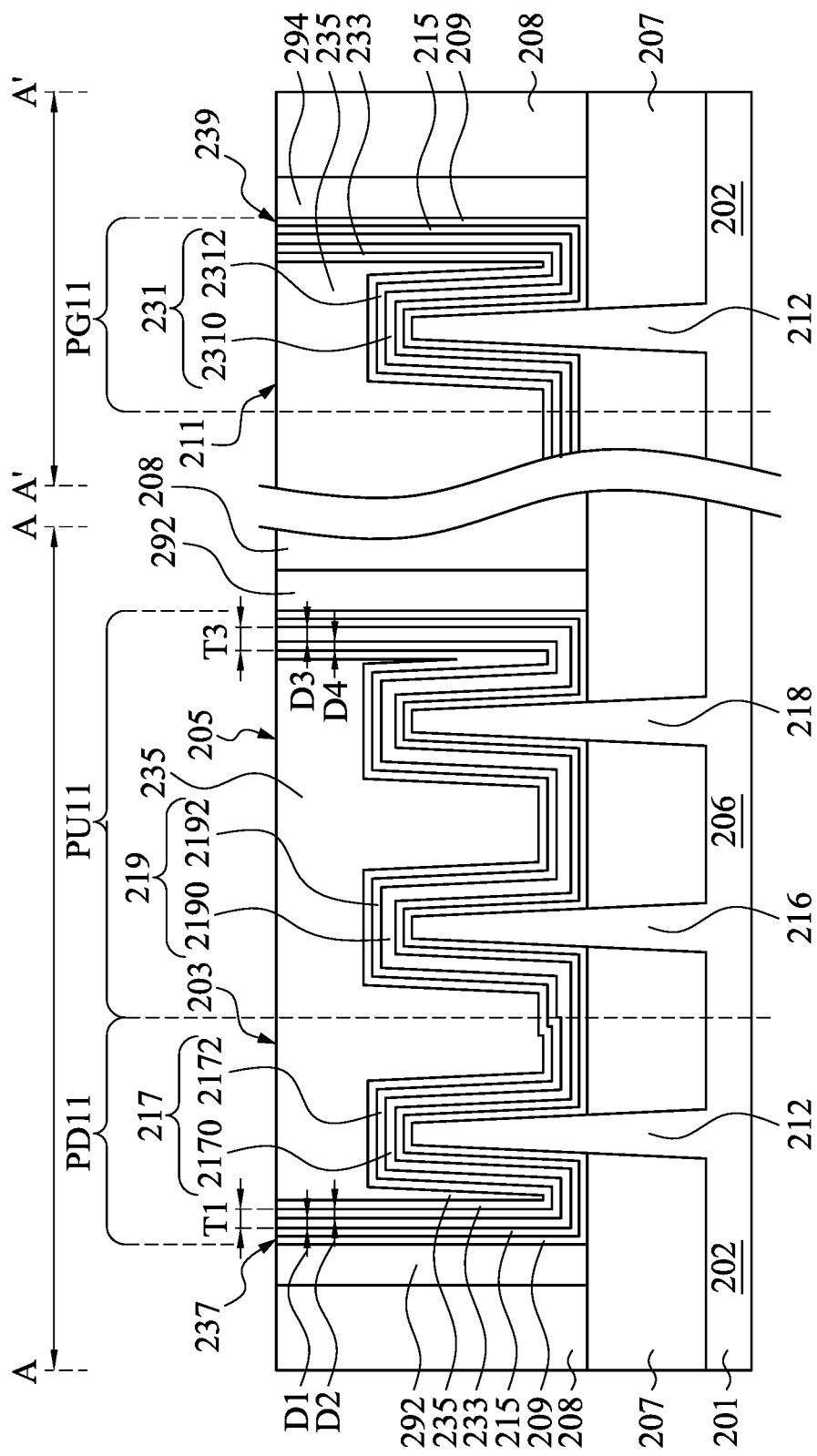
FIGS. 4A and 4B are cross-sectional views along section A-A and section B-B in FIGS. 3A and 3B respectively.
Figure 4B:
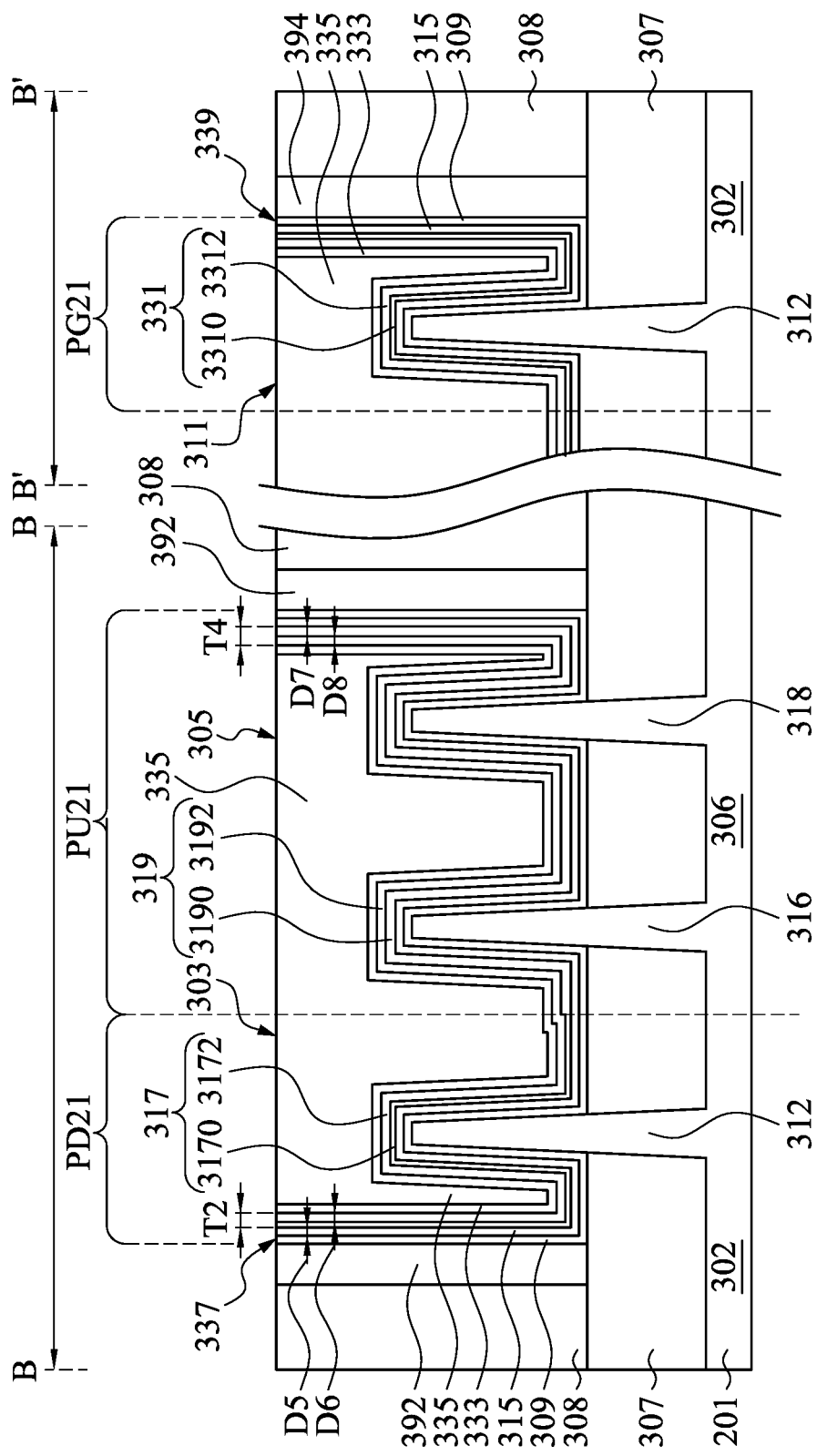

FIG. 4A is a cross-sectional view taking along sections A-A and A'-A' in FIG. 3A, and FIG. 4B is a cross-sectional view taking along sections B-B and B'-B' in FIG. 3B. Active structures 212, 216, and 218 of the first type memory cell 220 of FIG. 3A are formed over a substrate 201 as shown in FIG. 4A. The substrate 201 has the P-well regions 202 and the N-well region 206. In some embodiments, the substrate 201 is etched to form the active structures 212, 216, and 218 by depositing and patterning a hard mask layer (not shown) on the substrate 201. Specifically, the substrate 201 is etched to form the active structures 212 on the P-well regions 202 and to form the active structures 216 and 218 on the N-well region 206. The hard mask layer forms a pattern covering a portion of the substrate 201. Afterwards, the substrate 201 is etched to form trenches between the regions covered by the hard mask layer. As a result, the active structures 212, 216, and 218 are formed between the trenches. In some embodiments, the active structure 216 of the first type memory cell 220 may be act as an channel region and be made of a material, such as, silicon germanium (SiGe), in which the Ge atomic concentration of the fin structure 216 is within a range from about 10% to about 40%.

Afterwards, a dielectric material (e.g., silicon oxide) is deposited into the trenches and covers the active structures 212, 216, and 218 of the first type memory cell 220. The dielectric material is planarized down to the top surfaces of the active structures 212, 216, and 218 or the hard mask layer, and then the dielectric material is etched to a level below the top surfaces of the active structures 212, 216, and 218 to form an isolation structure 207. As a result, upper portions of the active structures 212, 216, and 218 protrude above the isolation structure 207, and lower portions of active structures 212, 216, and 218 are surrounded and covered by the isolation structure 207. It is noted that in some embodiments, the active structure 214 in FIG. 3A has similar structural and/or manufacturing details to the active structures 212, 216, and/or 218.

Alternatively, in some other embodiments, the isolation structure 207 is formed over substrate 201 in advance. Trenches between the isolation structure 207 are formed to expose the substrate 201. A semiconductor material, such as silicon, silicon germanium, or other applicable materials, is then grown in the trenches to form the active structures 212, 216, and 218 by using, for example, an epitaxial process. After the active structures 212, 216, and 218 are grown to the desired height, the isolation structure 207 is etched down to a level below the top surface of the active structures 212, 216, and 218. As a result, the portion of the active structures 212, 216, and 218 protrude above the isolation structure 207. In some embodiments, the active structures 216 and 218 have different materials and/or manufacturing methods from that of the active structures 212 and 214. For example, the active structures 216 and 218 are made of SiGe and are formed after the formation of the isolation structure 207 while the active structures 212 and 214 are made of Si and are formed before the formation of the isolation structure 207.

After the forming of the isolation structure 207, dummy gate structures (not shown) are formed over the active structures 212, 214, 216, and 218, the positions/patterns of the dummy gate structures are the same as that of the gate structures 222, 224, 226, 227, 228, and 229 as shown in FIG. 3A. The dummy gate structure may include a dummy gate dielectric and a dummy gate electrode over the dummy gate dielectric.

Spacer structures 292 and 294 are formed over the substrate 201 and surround the dummy gate structures. In some embodiments, epitaxy structures can be formed at least over portions of the active structures 212 and 214 to serve as source/drain features of the transistors PD11, PD12, PG11, and PG12. In some embodiments, the epitaxy structures may be made of SiP, SiC, SiPC, SiAs, Si, or combinations thereof. A dielectric layer 208 is then deposited on the active structures 212, 216, and 218 and the isolation structure 207 and surrounds the dummy gate structures and the spacer structures 292 and 294. Then, the dummy gate structures are removed to form an opening 237 to expose a portion of the fin structure 212 and the active structures 216 and 218, and to form an opening 239 to expose another portion of the active structure 212. Furthermore, still some openings (not shown in FIG. 4A) are formed to expose another portion of the active structure 214 of FIG. 3A.

After the active structures 212, 216, and 218 of the first type memory cell 220 are exposed from the opening 237 and the opening 239, a high-k gate dielectric layer 209 is conformally formed on the active structures 212, 214, 216, and 218. The high-k gate dielectric layer 209 includes oxide, nitride base dielectric, metal oxide dielectric, or the like. For example, the high-k gate dielectric layer 209 includes tantalum oxide, titanium oxide, hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or any combination thereof. In some embodiments, the high-k gate dielectric layer 2091 is formed by deposition processes, such as a chemical vapor deposition (CVD) process, a high density plasma chemical vapor deposition (HDPCVD) process, a spin-on process, a sputtering process, or other applicable processes.

After the forming of the high-k gate dielectric layer 209, a barrier layer 215 is conformally formed on the high-k gate dielectric layer 209. The barrier layer 215 inhibits diffusion of the metal that will be formed later and thus functions as a barrier to protect the high-k dielectric layer 209. In some embodiments, the barrier layer 215 includes metal nitrides such as TiN, TaN, or metal carbonitride such as titanium carbonitride or other quaternary layer which has a general formula (M1, M2) (C, N), wherein M1 and M2 are different metals of IVa or Va group. The barrier layer 215 is formed by various deposition techniques such as ALD, PVD, CVD, PECVD, or other suitable technique.

Afterwards, a first work function layer 217 is formed on the barrier layer 215 above the portion of the fin structure 212 of the P-well region 202 and has a thickness T1, a second work function layer 219 is formed on the barrier layer 215 above the active structures 216 and 218 of the N-well region 206 and has a thickness T3, and a third work function layer 231 is formed on the barrier layer 215 above the other portion of the active structure 212 of the P-well region 202. The thickness T1 is different from the thickness T3. For example, the thickness T1 is less than the thickness T3. For the first type memory cell 220, the first work function layer 217 is made of a first gate electrode material including a first group work function material, the second work function layer 219 is made of a second gate electrode material including a second group work function material, and the third work function layer 231 is made of a third gate electrode material including a third group work function material. Specifically, for the first type memory cell 220, the first work function layer 217 is made of a material that is the same as the third work function layer 231, but that is different from the second work function layer 219.

For example, each of the first work function layer 217, the second work function layer 219, and the third work function layer 231 includes multiple layers. The first work function layer 217 includes a first layer 2170 and a second layer 2172 over the first layer 2170. The second work function layer 219 includes a first layer 2190 and a second layer 2192 over the first layer 2190. The third work function layer 231 includes a first layer 2310 and a second layer 2312 over the first layer 2130. In some embodiments, the first layers 2170 and 2190 of the first and second work function layers 217 and 219 are made of TiN, and the second layers 2172 and 2192 of the first and second work function layer 217 and 219 are made of TiAl. The first layer 2190 of the second work function layer 219 has a thickness D3 different from a thickness D1 of the first layer 2170 of the first work function layer 217, and the second layer 2192 of the second work function layer 219 has a thickness D4 that is substantially the same as a thickness D2 of the second layer 2172 of the first work function layer 217. For example, the thickness D3 is greater than the thickness D1. In some embodiments, the first layer 2310 of the third work function layer 231 is made of TiN, and the second layer 2312 of the third work function layer 231 is made of TiAl. In some other embodiments, however, the first layers 2170 and 2190 of the first and second work function layers 217 and 219 are made of TiAl, and the second layers 2172 and 2192 of the first and second work function layer 217 and 219 are made of TiN. In some embodiments, the first layer 2310 of the third work function layer 231 is made of TiAl, and the second layer 2312 of the third work function layer 231 is made of TiN. The first layer 2190 of the second work function layer 219 has substantially the same thickness as the first layer 2170 of the first work function layer 217, and the second layer 2192 of the second work function layer 219 has a thickness different from a thickness of the second layer 2172 of the first work function layer 217. As such, the threshold voltages of the pull down device PD11 is different from the threshold voltages of the pull up device PU11. In some embodiments, the first work function layer 217, the second work function layer 219, and the third work function layer 231 are made of materials that are different from each other.

The work function layer 217 helps tune a work function for the pull down device PD11, the work function layer 219 helps tune a work function for the pull up device PU11, and the work function layer 231 helps tune a work function for the pass gate device PG11. Therefore, various desired threshold voltages are achieved for the pull down device PD11, the pull up device PU11, and the pass gate device PG11 respectively. Specifically, the pull down device PD11, the pull up device PU11, and the pass gate device PG11 are single-fin-line Fin Field-Effect Transistors (FinFETs) respectively. That is, the first type memory cell 220 is formed by fully single-fin-line FinFETs. In addition, the first type memory cell 220 has a first supply voltage Vdd1 with a write assist (not shown). In some embodiments, the first work function layer 217, the second work function layer 219, or the third work function layer 231 may include titanium nitride (TiN), titanium aluminum (TiAl), tungsten nitride (WN), tantalum nitride (TaN), tungsten (W), ruthenium (Ru), or any combination thereof.

Afterwards, a block layer 233 is formed on the first work function layer 217, the second work function layer 219, and the third work function layer 231. The block layer 233 is made of TiN or TiC. The block layer 233 is configured to block or reduce diffusion between the layer below (e.g. the first work function layer 217, the second work function layer 219, and the third work function layer 231) and the layer above (e.g. a metal fill layer).

After the forming of the block layer 233, a metal fill layer 235 is formed on block layer 233. Therefore, on the P-well region 202, a first gate electrode 203 is at least constructed by the work function layer 217, the block layer 233, and the metal fill layer 235, and a third gate electrode 211 is constructed by the work function layer 231, the block layer 233, and the metal fill layer 235. On the N-well region 206, a second gate electrode 205 is constructed by the work function layer 219, the block layer 233, and the metal fill layer 235. In some embodiments, the metal fill layer 235 includes conductive materials, such as aluminum (Al) or titanium (Ti), tungsten (W), copper (Cu), or any combination thereof.

As shown in FIG. 4B, active structures 312, 316, and 318 of the second type memory cell 230 of FIG. 3B are formed over a substrate 201 as shown in FIG. 4B. The substrate 201 has the P-well regions 302 and the N-well region 306. In some embodiments, the substrate 201 is etched to form the active structures 312, 316, and 318 by depositing and patterning a hard mask layer (not shown) on the substrate 201. Specifically, the substrate 201 is etched to form the active structures 312 on the P-well regions 302 and to form the active structures 316 and 318 on the N-well region 306. The hard mask layer forms a pattern covering a portion of the substrate 201. Afterwards, the substrate 201 is etched to form trenches between the regions covered by the hard mask layer. As a result, the active structures 312, 316, and 318 are formed between the trenches. In some embodiments, the fin structure 316 of the second type memory cell 230 may be act as an channel region and be made of a material, such as, silicon germanium (SiGe), in which the Ge atomic concentration of the active structure 316 is within a range from about 10% to about 40%.

Afterwards, a dielectric material (e.g., silicon oxide) is deposited into the trenches and covers the active structures 312, 316, and 318. The dielectric material is planarized down to the top surfaces of the active structures 312, 316, and 318 or the hard mask layer, and then the dielectric material is etched to a level below the top surfaces of the active structures 312, 316, and 318 to form an isolation structure 307. As a result, upper portions of the active structures 312, 316, and 318 protrude above the isolation structure 307, and lower portions of active structures 312, 316, and 318 are surrounded and covered by the isolation structure 307. It is noted that in some embodiments, the active structure 314 in FIG. 3B has similar structural and/or manufacturing details to the active structures 312, 316, and/or 318.

Alternatively, in some other embodiments, the isolation structure 307 is formed over substrate 201 in advance. Trenches between the isolation structure 307 are formed to expose the substrate 201. A semiconductor material, such as silicon, silicon germanium, or other applicable materials, is then grown in the trenches to form the active structures 312, 316, and 318 by using, for example, an epitaxial process. After the active structures 312, 316, and 318 are grown to the desired height, the isolation structure 307 is etched down to a level below the top surface of the active structures 312, 316, and 318. As a result, the portion of the active structures 312, 316, and 318 protrude above the isolation structure 307. In some embodiments, the active structures 316 and 318 have different materials and/or manufacturing methods from that of the active structures 312 and 314. For example, the active structures 316 and 318 are made of SiGe and are formed after the formation of the isolation structure 307 while the active structures 312 and 314 are made of Si and are formed before the formation of the isolation structure 307.

After the forming of the isolation structure 307, dummy gate structures (not shown) are formed over the active structures 312, 314, 316, and 318, the positions/patterns of the dummy gate structures are the same as that of the gate structures 322, 324, 326, 327, 328, and 329 as shown in FIG.

3B. The dummy gate structure may include a dummy gate dielectric and a dummy gate electrode over the dummy gate dielectric.

Spacer structures 392 and 394 are formed over the substrate 201 and surround the dummy gate structures. In some embodiments, epitaxy structures can be formed at least over portions of the active structures 312 and 314 to serve as source/drain features of the transistors PD21, PD22, PG21, and PG22. In some embodiments, the epitaxy structures may be made of SiP, SiC, SiPC, SiAs, Si, or combinations thereof. A dielectric layer 308 is then deposited on the active structures 312, 316, and 318 and the isolation structure 307 and surrounds the dummy gate structures and the spacer structures 392 and 394. Then, the dummy gate structures are removed to form an opening 337 to expose a portion of the active structures 312 and the active structures 316 and 318, and to form an opening 339 to expose another portion of the active structure 312. Furthermore, still some openings (not shown in FIG. 4B) are formed to expose another portion of the active structure 314 of FIG. 3B.

After the active structures 312, 316, and 318 of the second type memory cell 230 are exposed from the opening 337 and the opening 339, a high-k gate dielectric layer 309 is conformally formed on active structures 312, 314, 316, and 318. The high-k gate dielectric layer 309 includes hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like.

After the forming of the high-k gate dielectric layer 309, a barrier layer 315 is conformally formed on the high-k gate dielectric layer 309. The barrier layer 315 inhibits diffusion of the metal that will be formed later. and thus functions as a barrier to protect the high-k dielectric layer 309. In some embodiments, the barrier layer 315 includes metal nitrides such as TiN, TaN, or metal carbonitride such as titanium carbonitride or other quaternary layer which has a general formula (M1, M2) (C, N), wherein M1 and M2 are different metals of IVa or Va group. The barrier layer 315 is formed by various deposition techniques such as ALD, PVD, CVD, PECVD, or other suitable technique.

Afterwards, a first work function layer 317 is formed on the barrier layer 315 above the portion of the active structure 312 of the P-well region 302 and has a thickness T2, a second work function layer 319 is formed on the barrier layer 315 above the active structures 316 and 318 of the N-well region 306 and has a thickness T4, and a third work function layer 331 is formed on the barrier layer 315 above the other portion often active structure 312 of the P-well region 302. The thickness T2 is different from the thickness T4. For example, the thickness T2 is less than the thickness T4. For the second type memory cell 320, the first work function layer 317 is made of a first gate electrode material including a first group work function material, the second work function layer 319 is made of a second gate electrode material including a second group work function material, and the third work function layer 331 is made of a third gate electrode material including a third group work function material. Specifically, for the second type memory cell 320, the first work function layer 317 is made of a material that is the same as the third work function layer 331, but that is different from the second work function layer 319.

For example, each of the first work function layer 317, the second work function layer 319, and the third work function layer 331 includes multiple layers. The first work function layer 317 includes a first layer 3170 and a second layer 3172 over the first layer 3170. The second work function layer 319 includes a first layer 3190 and a second layer 3192 over the first layer 3190. The third work function layer 331 includes a first layer 3310 and a second layer 3312. In some embodiments, the first layers 3170 and 3190 of the first and second work function layers 317 and 319 are made of TiN, and the second layers 3172 and 3192 of the first and second work function layer 317 and 319 are made of TiAl. The first layer 3190 of the second work function layer 319 has a thickness D7 different from a thickness D5 of the first layer 3170 of the first work function layer 317, and the second layer 3192 of the second work function layer 319 has a thickness D8 which is substantially the same as a thickness D6 of the second layer 3172 of the first work function layer 317. For example, the thickness D7 is greater than the thickness D5. In some embodiments, the first layer 3310 of the third work function layer 331 is made of TiN, and the second layer 3312 of the third work function layer 331 is made of TiAl. In some other embodiments, however, the first layers 3170 and 3190 of the first and second work function layers 317 and 319 are made of TiAl, and the second layers 3172 and 3192 of the first and second work function layer 317 and 319 are made of TiN. In some embodiments, the first layer 3310 of the third work function layer 331 is made of TiAl, and the second layer 3312 of the third work function layer 331 is made of TiN. The first layer 3190 of the second work function layer 319 has substantially the same thickness as the first layer 3170 of the first work function layer 317, and the second layer 3192 of the second work function layer 319 has a thickness different from a thickness of the second layer 3172 of the first work function layer 317. As such, the threshold voltages of the pull down device PD21 is different from the threshold voltages of the pull up device PU21. In some embodiments, the first work function layer 317, the second work function layer 319, and the third work function layer 331 are made of materials that are different from each other.

More specifically, in some embodiments, the first work function layer 317 of the second type memory cell 320 is made of a material that is different from the first work function layer 217 of the first type memory cell 220, and that can induce a threshold voltage different from a threshold voltage of the first type memory cell 220. In some embodiments, the second work function layer 319 of the second type memory cell 320 is made of a material that is different from the second work function layer 219 of the first type memory cell 220, and that can induce a threshold voltage different from a threshold voltage of the first type memory cell 220. On the other hand, the thickness T1 of the first work function layer 217 of the first type memory cell 220 shown in FIG. 4A is thicker than the thickness T2 of the first work function layer 317 of the second type memory cell 320. Furthermore, the thickness D2 of the second layer 2172 of the first work function layer 217 shown in FIG. 4A is substantially the same as the thickness D6 of the second layer 3172 of the first work function layer 317, but the thickness D1 of the first layer 2170 of the first work function layer 217 shown in FIG. 4A is thicker than the thickness D5 of the first layer 3170 of the first work function layer 317. For example, a TiN layer of the first work function layer 217 is thicker than a TiN layer of the first work function layer 317. In some embodiments, the thickness T3 of the second work function layer 219 of the first type memory cell 220 shown in FIG. 4A is thinner than the thickness T4 of the second work function layer 319 of the second type memory cell 320. For example, the first layer 2190 of the second work function layer 219 is thinner than the first layer 3190 of the second work function layer 319. Furthermore, the thickness D4 of the second layer 2192 of the second work function layer 219 shown in FIG. 4A is substantially the same as the thickness D8 of the second layer 3192 of the second work function layer 319, but the thickness D3 of the first layer 2190 of the second work function layer 219 shown in FIG. 4A is less than the thickness D7 of the first layer 3190 of the second work function layer 319.

The work function layer 317 helps tune a work function for the pull down device PD21, the work function layer 319 helps tune a work function for the pull up device PU21, and the work function layer 331 helps tune a work function for the pass gate device PG21. Therefore, various desired threshold voltages are achieved for the pull down device PD21, the pull up device PU21, and the pass gate device PG21 respectively. Furthermore, the first threshold voltage Vt1 of each of the pass gate devices PG11 and PG12 of the first type memory cell 220 is higher than the third threshold voltage Vt3 of each of the pass gate devices PG21 and PG22 of the second type memory cell 320 at least about 40 mV. In some embodiments, the second threshold voltage Vt2 of each of the pull up devices PU11 and PU12 of the first type memory cell 220 is higher than the fourth threshold voltage Vt4 of each of the pull up devices PU21 and PU22 of the second type memory cell 320 at least about 40 mV.

Specifically, the pull down device PD21, the pull up device PU21, and the pass gate device PG21 are single-fin-line FinFETs respectively. That is, the second type memory cell 320 is formed by fully single-fin-line FinFETs. In addition, the second type memory cell 320 has second supply voltage Vdd2 with or without a write assist which higher than the first supply voltage Vdd1 of the first type memory cell 220 at least about 50 mV, but the disclosure herein is not limited thereto. In some embodiments, the first work function layer 317, the second work function layer 319, or the third work function layer 331 may include titanium nitride (TiN), titanium aluminum (TiAl), tungsten nitride (WN), tantalum nitride (TaN), tungsten (W), ruthenium (Ru), or any combination thereof.

Afterwards, a block layer 333 is formed on the first work function layer 317, the second work function layer 319, and the third work function layer 331. The block layer 333 is made of TiN or TiC. The block layer 333 is configured to block or reduce diffusion between the layer below (e.g. the first work function layer 317, the second work function layer 319, and the third work function layer 331) and the layer above (e.g. a metal fill layer).

After the forming of the block layer 333, a metal fill layer 335 is formed on block layer 333. Therefore, on the P-well region 302, a first gate electrode 303 is constructed by the work function layer 317, the block layer 333, and the metal fill layer 335, and a third gate electrode 311 is constructed by the work function layer 331, the block layer 333, and the metal fill layer 335. On the N-well region 306, a second gate electrode 305 is constructed by the work function layer 319, the block layer 333, and the metal fill layer 335. In some embodiments, the metal fill layer 335 includes conductive materials, such as aluminum (Al) or titanium (Ti), tungsten (W), copper (Cu), or any combination thereof. As such, the first gate electrode 303 of the second type memory cell 320 is different from the first gate electrode 203 of the first type memory cell 220. In some embodiments, the third gate electrode 311 of the second type memory cell 320 is different from the third gate electrode 211 of the first type memory cell 220.

In sum, the integrated circuit chip provides a reasonable channel width with small area and allows channel length for continuing shrink. From a cell size point of view, the single fin transistor for cell devices is a good option for designing a high-density SRAM cell. Further, the design for the single fin transistor on the SRAM cell is also provided the additional benefit on cell standby leakage due to less width. Furthermore, the arrangement of the memory devices 110, 140, 144, and 160 (shown in FIG. 1) may have both high density and high speed cell offering for the case of the chip dimension reduction. Specifically, the first type memory cell 220 provides a function of high-density/low standby, and the second type memory cell 320 provides another function of high-density/high-speed in one chip.

Figure 5A:
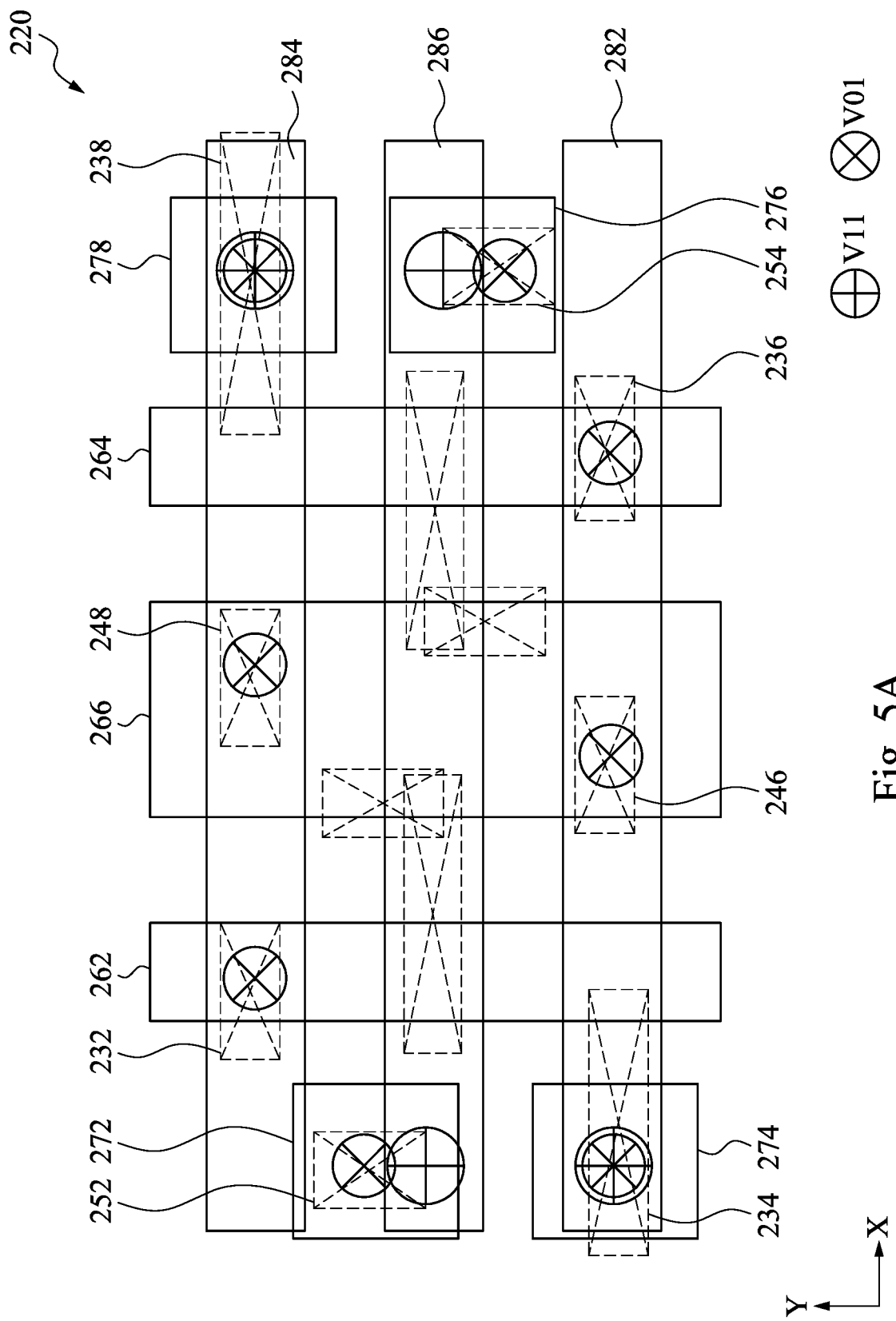
FIGS. 5A and 5B are top views of the first type memory cell and the second type memory cell in FIGS. 3A and 3B respectively, with emphasis of the components at the first metal layer and a second metal layer of the chip, in accordance with some embodiments.
Figure 5B:
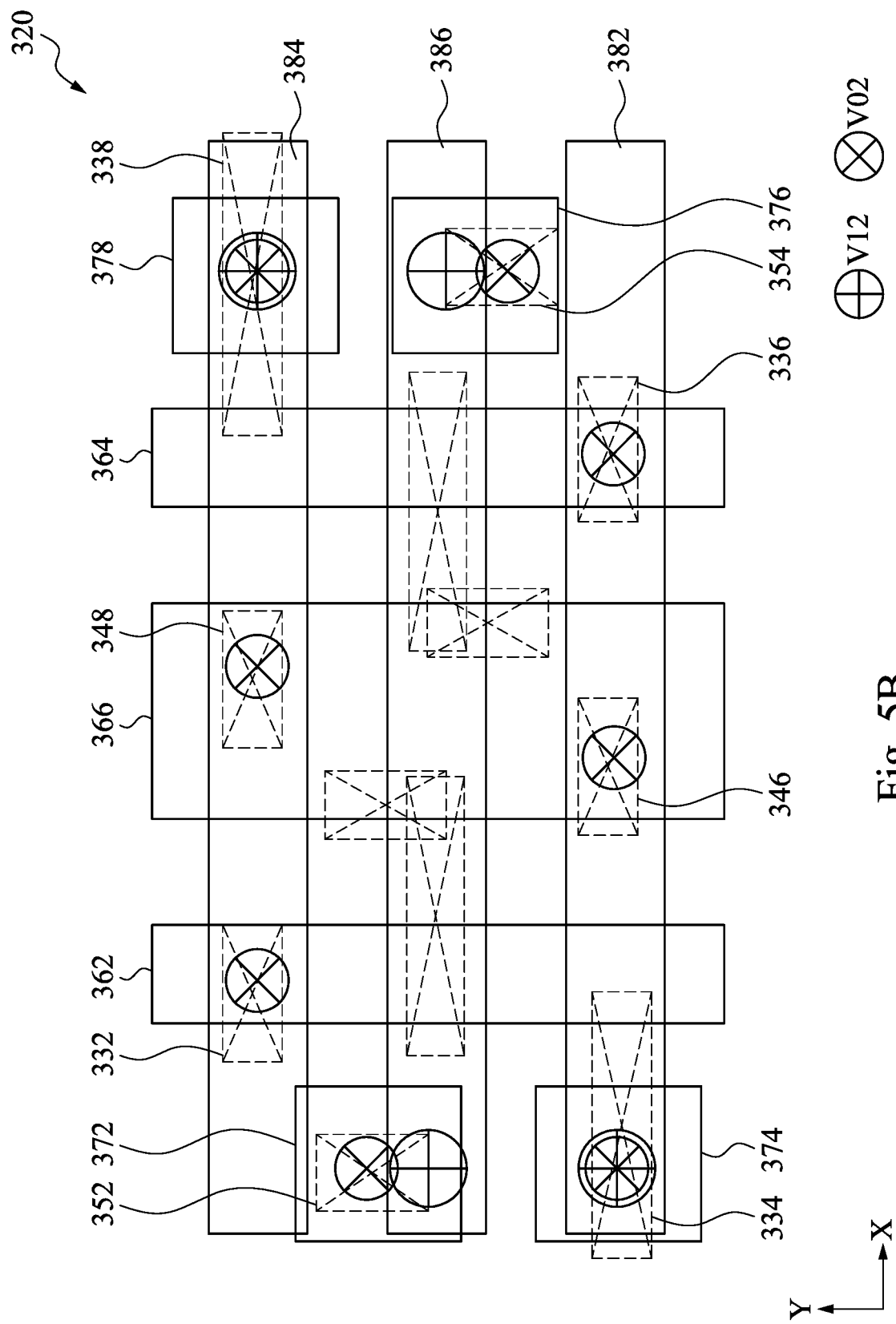

FIGS. 5A and 5B are top views of the first type memory cell 220 and the second type memory cell 320 in FIGS. 3A and 3B respectively, with emphasis of the components at the first metal layer and a second metal layer of the chip, in accordance with some embodiments. Components in FIGS. 5A and 5B that are the same or similar to those in FIGS. 3A and 3B respectively are given the same reference numbers, and detailed description thereof is thus omitted. Some components of the memory cell 220 and the memory cell 320 are not depicted in FIGS. 5A and 5B, or depicted in dotted lines, or not labeled for clarity of FIGS. 5A and 5B.

Reference is made to FIGS. 2A and 5A. The memory cell 220 includes a plurality of conductive line segments 262, 264, 266, 272, 274, 276, 278, 282, 284, and 286. The conductive line segments 262, 264, and 266 extend along the direction Y in a first metal layer of a chip in which the first type memory cell 220 is formed. The conductive line segments 272, 274, 276, and 278 function as landing pads and are also in the first metal layer. The conductive line segments 272, 274, 276, and 278 are also referred to as landing pads in this disclosure. The conductive line segments 282, 284, and 286 extend along the direction X in a second metal layer of the chip. The second metal layer is over the first metal layer. In some embodiments, each segment of the conductive line segments 282, 284, and 286 is a portion of a corresponding reference line or word line that extends along the direction X and electrically coupled with all memory cells of the same row. The memory cell 220 includes a plurality of via plugs V01 connecting conductive line segments of the first metal layer with the corresponding active contact structures 232, 234, 236, and 238 and the gate contact structures 252 and 254. The memory cell 220 further includes a plurality of via plugs V11 connecting the various landing pads 272, 274, 276, and 278 of the first metal layer with the various conductive line segments 282, 284, and 286 of the second metal layer.

The conductive line segment 262 extends along the direction Y and is electrically coupled with the active contact structure 232 through a corresponding one of the via plugs V01. The conductive line segment 262 is thus electrically coupled with the node NBL1 of the first type memory cell 220. In some embodiments, the conductive line segment 262 is a bit line segment that constitutes a portion of the bit line BL1 of a column of first type memory cells where first type memory cell 220 is disposed. The conductive line segment 264 extends along the direction Y and is electrically coupled with the active contact structure 236 through a corresponding one of the via plugs V01. The conductive line segment 264 is thus electrically coupled with the node NBLB1 of the first type memory cell 220. In some embodiments, the conductive line segment 264 is a bit line segment that constitutes a portion of the bit line BLB1 of the column of first type memory cells where the first type memory cell 220 is disposed.

The conductive line segment 266 extends along the direction Y and is electrically coupled with the active contact structures 246 and 248 through a corresponding one of the via plugs V01. The conductive line segment 266 is thus electrically coupled with the node NVDD1 of first type memory cell 220. In some embodiments, the conductive line segment 266 is a supply voltage line segment that constitutes a portion of a supply voltage line of the column of first type memory cells where the first type memory cell 220 is disposed.

The landing pad 272 and the landing pad 274 are aligned along the direction Y. The landing pad 272 is electrically coupled with the gate contact structure 252 through a corresponding one of the via plugs V01. The landing pad 272 is thus electrically coupled with the gate or control terminal of the pass gate device PG11 of first type memory cell 220. In some embodiments, the landing pad 272 is also referred to as a word line landing pad of the first type memory cell 220. The landing pad 274 is electrically coupled with the active contact structure 234 through a corresponding one of the via plugs V01. The landing pad 274 is thus electrically coupled with the node NVSS1 of the first type memory cell 220. In some embodiments, the landing pad 274 is also referred to as a reference line landing pad of the first type memory cell 220.

The landing pad 276 and the landing pad 278 are aligned along the direction Y. The landing pad 276 is electrically coupled with the gate contact structure 254 through a corresponding one of the via plugs V01. The landing pad 276 is thus electrically coupled with the gate or control terminal of the pass gate device PG12 of the first type memory cell 220. In some embodiments, the landing pad 276 is also referred to as another word line landing pad of the first type memory cell 220. The landing pad 278 is electrically coupled with the active contact structure 238 through a corresponding one of the via plugs V01. The landing pad 278 is thus electrically coupled with the node NVSS1 of the first type memory cell 220. In some embodiments, the landing pad 274 is also referred to as another reference line the landing pad of the first type memory cell 220.

The conductive line segment 282 extends along the direction X and is electrically coupled with the reference line landing pad 274 through a corresponding one of the via plugs V11. The conductive line segment 282 is thus electrically coupled with the node NVSS1 of the first type memory cell 220. In some embodiments, the conductive line segment 282 is a reference line segment that constitutes a portion of a reference voltage line of a row of first type memory cells where the first type memory cell 220 is disposed.

The conductive line segment 284 extends along the direction X and is electrically coupled with the reference line landing pad 278 through a corresponding one of the via plugs V11. The conductive line segment 284 is thus also electrically coupled with the node NVSS1 of the first type memory cell 220. In some embodiments, the conductive line segment 284 is another reference line segment that constitutes a portion of another reference voltage line of the row of first type memory cells where the first type memory cell 220 is disposed. The conductive line segment 286 extends along the direction X and is electrically coupled with the word line landing pads 272 and 276 through the corresponding via plugs V11. The conductive line segment 286 is thus electrically coupled with control terminals of the pass gate devices PG11 and PG12 of the first type memory cell 220. In some embodiments, the conductive line segment 286 is a word line segment that constitutes a portion of a word line of the row of first type memory cells where the first type memory cell 220 is disposed. The conductive line segment 286 has a line width W1 measurable along the direction Y.

As shown in FIGS. 2B and 5B, the memory cell 320 includes a plurality of conductive line segments 362, 364, 366, 372, 374, 376, 378, 382, 384, and 386. The conductive line segments 362, 364, and 366 extend along the direction Y in a first metal layer of a chip in which the second type memory cell 320 are formed. The conductive line segments 372, 374, 376, and 378 function as landing pads and are also in the first metal layer. The conductive line segments 372, 374, 376, and 378 are also referred to as landing pads in this disclosure. The conductive line segments 382, 384, and 386 extend along the direction X in a second metal layer of the chip. The second metal layer is over the first metal layer. In some embodiments, each segment of the conductive line segments 382, 384, and 386 is a portion of a corresponding reference line or word line that extends along the direction X and electrically coupled with all memory cells of the same row. The memory cell 320 includes a plurality of via plugs V02 connecting conductive line segments of the first metal layer with the corresponding active contact structures 332, 334, 336, and 338 and gate contact structures 352 and 354. The memory cell 220 further includes a plurality of via plugs V12 connecting the various landing pads 372, 374, 376, and 378 of the first metal layer with the various conductive line segments 382, 384, and 386 of the second metal layer.

The conductive line segment 362 extends along the direction Y and is electrically coupled with the active contact structure 332 through a corresponding one of the via plugs V02. The conductive line segment 362 is thus electrically coupled with the node NBL2 of the first type memory cell 320. In some embodiments, the conductive line segment 362 is a bit line segment that constitutes a portion of the bit line BL2 of a column of first type memory cells where the first type memory cell 320 is disposed. The conductive line segment 364 extends along the direction Y and is electrically coupled with the active contact structure 336 through a corresponding one of the via plugs V02. The conductive line segment 264 is thus electrically coupled with the node NBLB2 of the first type memory cell 320. In some embodiments, the conductive line segment 364 is a bit line segment that constitutes a portion of the bit line BLB2 of the column of first type memory cells where the first type memory cell 320 is disposed.

The conductive line segment 366 extends along the direction Y and is electrically coupled with the active contact structures 346 and 348 through a corresponding one of the via plugs V02. The conductive line segment 366 is thus electrically coupled with the node NVDD2 of the first type memory cell 320. In some embodiments, the conductive line segment 366 is a supply voltage line segment that constitutes a portion of a supply voltage line of the column of first type memory cells where the first type memory cell 320 is disposed.

The landing pad 372 and the landing pad 374 are aligned along the direction Y. The landing pad 372 is electrically coupled with the gate contact structure 252 through a corresponding one of the via plugs V02. The landing pad 372 is thus electrically coupled with the gate or control terminal of the pass gate device PG21 of the first type memory cell 320. In some embodiments, the landing pad 372 is also referred to as a word line landing pad of the first type memory cell 320. The landing pad 374 is electrically coupled with the active contact structure 334 through a corresponding one of the via plugs V02. The landing pad 374 is thus electrically coupled with the node NVSS2 of the first type memory cell 320. In some embodiments, the landing pad 374 is also referred to as a reference line landing pad of the first type memory cell 320.

The landing pad 376 and the landing pad 378 are aligned along the direction Y. The landing pad 376 is electrically coupled with the gate contact structure 354 through a corresponding one of the via plugs V02. The landing pad 376 is thus electrically coupled with the gate or control terminal of the pass gate device PG22 of the first type memory cell 320. In some embodiments, the landing pad 376 is also referred to as another word line landing pad of the first type memory cell 320. The landing pad 378 is electrically coupled with the active contact structure 338 through a corresponding one of the via plugs V02. The landing pad 378 is thus electrically coupled with the node NVSS2 of the first type memory cell 320. In some embodiments, the landing pad 374 is also referred to as another reference line the landing pad of the first type memory cell 320.

The conductive line segment 382 extends along the direction X and is electrically coupled with the reference line landing pad 374 through a corresponding one of the via plugs V12. The conductive line segment 382 is thus electrically coupled with the node NVSS2 of the first type memory cell 320. In some embodiments, the conductive line segment 382 is a reference line segment that constitutes a portion of a reference voltage line of a row of first type memory cells where the first type memory cell 320 is disposed.

The conductive line segment 384 extends along the direction X and is electrically coupled with the reference line landing pad 378 through a corresponding one of the via plugs V12. The conductive line segment 384 is thus also electrically coupled with the node NVSS2 of the first type memory cell 320. In some embodiments, the conductive line segment 384 is another reference line segment that constitutes a portion of another reference voltage line of the row of first type memory cells where the first type memory cell 320 is disposed. The conductive line segment 386 extends along the direction X and is electrically coupled with the word line landing pads 372 and 376 through the corresponding via plugs V12. The conductive line segment 386 is thus electrically coupled with control terminals of the pass gate devices PG21 and PG22 of the first type memory cell 320. In some embodiments, the conductive line segment 386 is a word line segment that constitutes a portion of a word line of the row of first type memory cells where the first type memory cell 320 is disposed. The conductive line segment 386 has a line width W1 measurable along the direction Y.

Figure 6A:
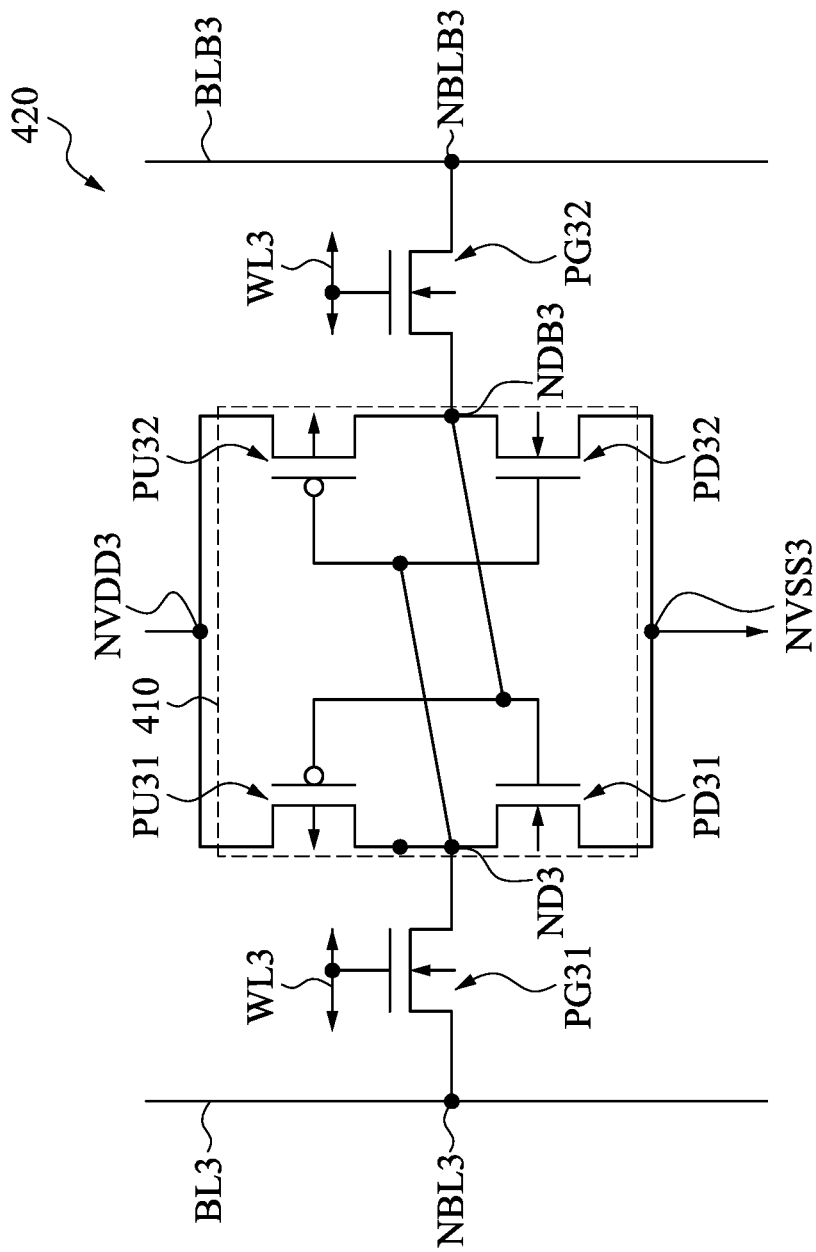
FIG. 6A is schematic circuit diagram of a third type memory cell in accordance with some embodiments.

FIG. 6A is schematic circuit diagram of the third memory cell 420 of FIG. 1 in accordance with some embodiments. The third memory cell 420 includes a storage circuit 410 having data nodes ND3 and NDB3, two pass gate devices PG31 and PG32, a supply voltage node NVDD3, a reference voltage node NVSS3, a first bit line BL3, a second bit line BLB3, and a word line WL3. The pass gate device PG31 is electrically coupled with the data node ND3, the bit line BL3, and the word line WL3. The pass gate device PG32 is electrically coupled with the data node NDB3, the bit line BLB3, and the word line WL3.

The pass gate devices PG31 and PG32 can be N-type metal oxide semiconductor (NMOS) transistors. A drain of the pass gate device PG31 is electrically coupled with the bit line BL3 at the node NBL3. A source of the pass gate device PG31 is electrically coupled with the data node ND3. A drain of the pass gate device PG32 is electrically coupled with the bit line BLB3 at the node NBLB3. A source of the pass gate device PG32 is electrically coupled with the data node NDB3. A gate of the pass gate device PG31 and a gate of the pass gate device PG32 are electrically coupled with the word line WL3. The gates of the pass gate devices PG31 and PG32 are control terminals thereof configured to receive a control signal for turning on or off the pass gate devices PG31 and PG32.

The storage circuit 410 includes two pull up devices PU31 and PU32 and two pull down devices PD31 and PD32. The two pull up devices PU31 and PU32 can be P-type metal oxide semiconductor (PMOS) transistors, and the two pull down devices PD31 and PD32 can be N-type metal oxide semiconductor (NMOS) transistors. The pull up devices PU31 and PU32 and the pull down devices PD31 and PD32 form a cross latch having two cross-coupled inverters. The pull up device PU31 and pull down device PD31 form a first inverter while the pull up device PU32 and the pull down device PD32 form a second inverter.

Drains of the pull up device PU31 and the pull down device PD31 are coupled together and form the data node ND3. Drains of the pull up device PU32 and the pull down device PD32 are coupled together and form the data node NDB3. Gates of the pull up device PU31 and the pull down device PD31 are coupled together and to the drains of the pull up device PU32 and the pull down device PD32. Gates of the pull up device PU32 and the pull down device PD32 are coupled together and to the drains of the pull up device PU31 and the pull down device PD31. Sources of the pull up devices PU31 and PU32 are coupled with the supply voltage node NVDD3. In some embodiments, the supply voltage node NVDD3 is configured to receive a supply voltage VDD3. The sources of the pull down devices PD31 and PD32 are coupled with the reference voltage node NVSS3.

In some embodiments, the reference voltage node NVSS3 is configured to receive a ground reference voltage VSS3. In some embodiments, the bit lines BL3 and BLB3 are coupled to each drain of the pass gate devices PG31 and PG32 of memory cells in a column of the memory array, and the word line WL3 is coupled to each gate of the pass gate devices PG31 and PG32 of memory cells in a row of the memory array.

Figure 6B:
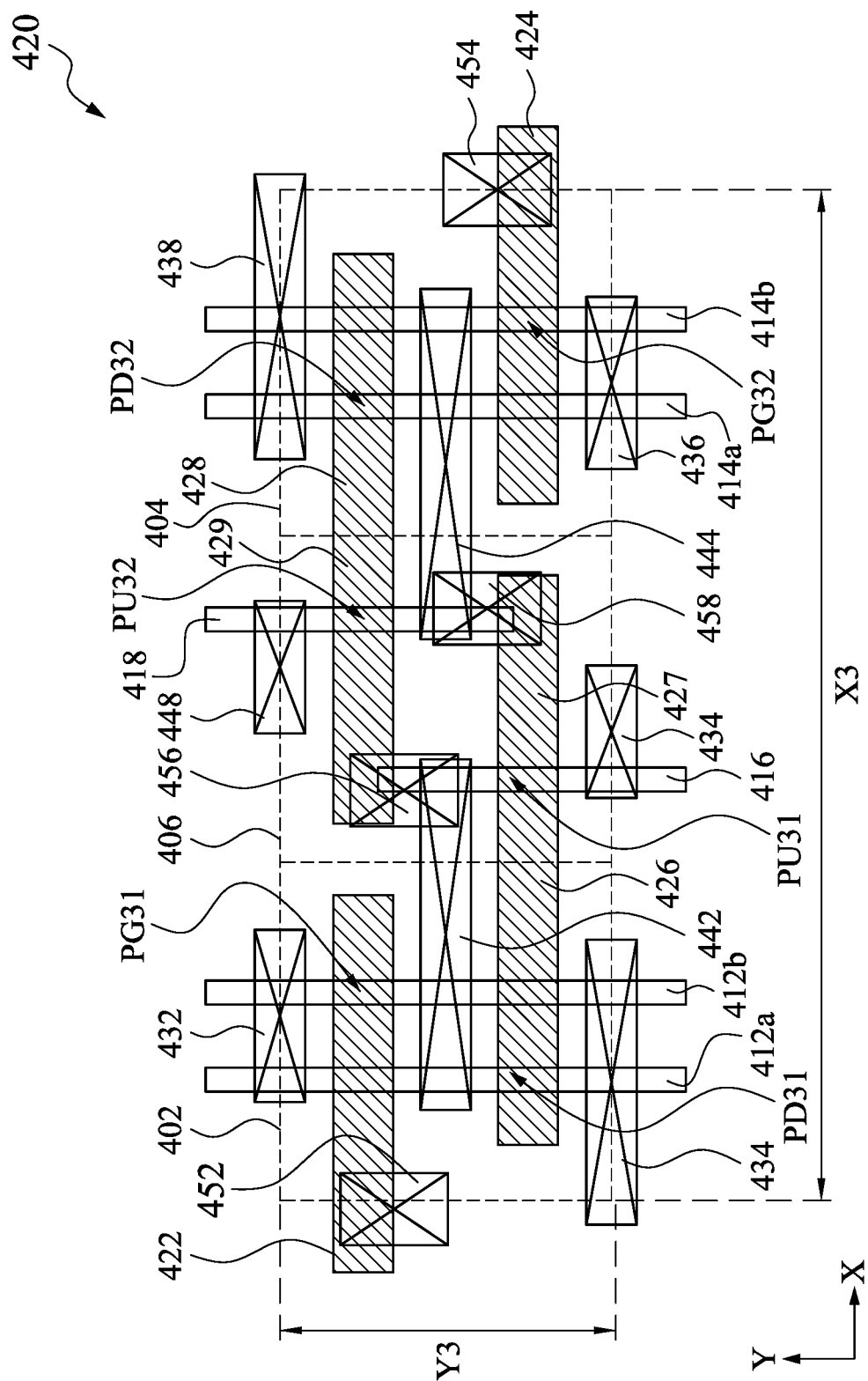
FIG. 6B is top views of the third type memory cell, with all the depictions regarding components at and over a first metal layer of a chip omitted, in accordance with some embodiments.

FIG. 6B is a top view of a third type memory cell 420, with the depictions regarding components at and over a first metal layer of a chip omitted, in accordance with some embodiments. Moreover, the depictions regarding via plugs connecting various components depicted in FIG. 6B and the first metal layer are omitted. Some components of the third type memory cell 420 are not shown in FIG. 6B for clarity of FIG. 6B.

The memory cell 420 includes a substrate (not labeled) having P-well regions 402 and 404 and an N-well region 406 between the P-well regions 402 and 404. The memory cell 420 includes a plurality of active structures 412a, 412b, 414a, 414b, 416, and 418 extending along the direction Y; a plurality of gate structures 422, 424, 426, 427, 428, and 429 extending along the direction X; a plurality of active contact structures 432, 434, 436, 438, 442, 444, 446, and 448; and a plurality of gate contact structures 452, 454, 456, and 458. Except active structures 412a, 412b, 414a, and 414b, each component depicted in FIG. 6B and a counterpart component depicted in FIG. 3A that have the same last two-digit reference number correspond to each other, and detailed description thereof is thus omitted.

Compared with the first type memory cell 220 of FIG. 3A, the third type memory cell 420 replaces the active structure 212 with the active structures 412a and 412b and replaces the active structure 214 with the active structures 414a and 414b.

The gate structure 422 overlaps the active structures 412a and 412b and functions as a gate of the pass gate device PG31. That is, the active structures 412a and 412b and the gate structure 422 form the pass gate device PG31. The active contact structures 432 and 442 overlap the active structures 412a and 412b and correspond to a source contact and a drain contact of the pass gate device PG31. The gate structure 422, the active structures 412a and 412b, and the active contact structures 432 and 442 are configured as two transistors connected in parallel. In some embodiments, the pass gate device PG31 of the third type memory cell 420 is configured to have a driving capability greater than that of the pass gate device PG11 of the first type memory cell 220. In some embodiments, the driving capability of the pass gate device PG31 of the third type memory cell 420 is about twice the driving capability of the pass gate device PG11 of the first type memory cell 220.

The gate contact structure 452 contacts the gate structure 422 and functions as a landing pad for the gate structure 422 to electrically interconnect the gate structure 422 to the word line WL3 of FIG. 6A. The gate structure 424 overlaps the active structures 414a and 414b and functions as a gate of pass gate device PG32. That is, the active structures 414a and 414b and the gate structure 424 form the pass gate device PG32. The active contact structures 436 and 444 overlap the active structures 414a and 414b and correspond to a source contact and a drain contact of the pass gate device PG32. The gate contact structure 454 contacts the gate structure 424 and functions as a landing pad for the gate structure 424 to electrically interconnect the gate structure 424 to the word line WL3 of FIG. 6A. In some embodiments, the pass gate device PG32 of third type memory cell 420 is configured to have a driving capability greater than that of the pass gate device PG12 of the first type memory cell 220 in a manner similar to the pass gate device PG31. In some embodiments, the driving capability of the pass gate device PG32 of the third type memory cell 420 is about twice the driving capability of the pass gate device PG12 of the first type memory cell 220.

The gate structure 426 also overlaps the active structures 412a and 412b and functions as a gate of the transistor PD31. That is, the active structures 412a and 412b and the gate structure 426 form the pull down device PD31. The active contact structures 434 and 442 overlap the active structures 412a and 412b and correspond to a source contact and a drain contact of the transistor PD31. The gate structure 428 overlaps the active structures 414a and 414b and functions as a gate of the pull down device PD32. That is, the active structures 414a and 414b and the gate structure 428 form the pull down device PD32. The active contact structures 438 and 436 overlap the active structures 414a and 414b and correspond to a source contact and a drain contact of the pull down device PD32. In some embodiments, the pass gate devices PG31 and PG32 and the pull down devices PD31 and PD32 are Fin Field-Effect Transistors (FinFETs) with multiple-fin-lines respectively, and have the same gate electrodes as the pass gate device PG11 and PG12 and the pull down devices PD11 and PD12 of the first type memory cell 220. In some embodiments, the transistor PD31 of the third type memory cell 420 is configured to have a driving capability greater than that of the pull down device PD11 of the first type memory cell 220. In some embodiments, the pull down device PD32 of the third type memory cell 420 is configured to have a driving capability greater than that of the pull down device PD12 of the first type memory cell 220.

The memory cell 420 has a cell width X3 measurable along the direction X and a cell height Y3 measurable along the direction Y. In some applications, a memory macro is formed by repeating and abutting memory cells having a configuration identical or mirrored-identical to the memory cell 420, and thus the cell width X3 is also referred to as a cell pitch along the direction X, and the cell height Y3 is also referred to as a cell pitch along the direction Y. In some embodiments, a ratio of the cell width X3 to the cell height Y3 is greater than one.

In some embodiments, the cell height Y1 of FIG. 3A equals the cell height Y3. In some embodiments, a ratio of the cell width X3 to the cell width X1 of FIG. 3A is greater than about 1.15. Therefore, the memory cell 420 has at least about 1.15 times of cell size than that of the memory cell 220. In some embodiments, the ratio of the cell width X3 to the cell width X1 ranges from about 1.23 to about 1.25. In some embodiments, in a given manufacturing process, the ratio of the cell width X3 to cell width X1 is determinable based on the additional width usable to accommodate the formation of additional active structures, such as the active structures 412a/412b versus the active structure 212 for the transistor PD1 and the pass gate device PG1 or the active structures 414a/414b versus the active structure 214 for the transistor PD2 and the pass gate device PG2.

FIG. 7 is a flowchart of a method 1000 of forming memory devices in accordance with some embodiments. It is understood that additional operations may be performed before, during, and/or after the method 1000 depicted in FIG. 7, and that some other processes may be briefly described herein.

Reference is made to FIGS. 1 to 3B and 7. The method 1000, where the various transistors of memory device 110, 140, 144, and 160 (FIG. 1) are formed over the substrate 201, includes forming the pass gate devices PG11 and PG12, the pull down devices PD11 and PD12, and the pull up devices PU11 and PU12 for the first type memory cells 220 of the first memory device 110 (operation 1012), forming the pass gate devices PG21 and PG22, the pull down devices PD21 and PD22, and the pull up devices PU21 and PU22 for the second type memory cells 320 of the second memory devices 140 and 144 (operation 1014), and forming the pass gate devices PG31 and PG32, the pull down devices PD31 and PD32, and the pull up devices PU31 and PU32 for the third type memory cells 420 of the second memory devices 160 (operation 1016). Furthermore, the memory cell 320 substantially has the same size (or the same cell pitch) as the memory cell 220, and the third type memory cell 420 has a cell size larger than that of the first or second type memory cell 220 or 320.

Reference is made to FIGS. 4A and 4B and 7. Specifically, for the first memory device 110, each of the pull down devices PD11 and PD12 includes a first gate electrode 203 including a first work function layer 217 which is made of a first gate electrode material including a first group work function material and has a first thickness T1, and each of the pull up devices PU11 and PU12 includes a second gate electrode 205 including a second work function layer 219 which is made of a second gate electrode material including a second group work function material and has a thickness T3. For the second memory devices 140 and 144, each of the pull down devices PD21 and PD22 includes a first gate electrode 303 including a first work function layer 317 which is made of a first gate electrode material including a first group work function material and has a thickness T2, and each of the pull up devices PU21 and PU22 includes a second gate electrode 305 including a second work function layer 319 which is made of a second gate electrode material including a second group work function material and has a thickness T4.

More specifically, in some embodiments, the first work function layer 317 of the second type memory cell 320 is made of a material that is different from the first work function layer 217 of the first type memory cell 220, and that can induce a threshold voltage different from a threshold voltage of the first type memory cell 220. In some embodiments, the second work function layer 319 of the second type memory cell 320 is made of a material that is different from the second work function layer 219 of the first type memory cell 220, and that can induce a threshold voltage different from a threshold voltage of the first type memory cell 220. On the other hand, the thickness T1 of the first work function layer 217 of the first type memory cell 220 shown in FIG. 4A is thicker than the thickness T2 of the first work function layer 317 of the second type memory cell 320. In some embodiments, the thickness T3 of the second work function layer 219 of the first type memory cell 220 shown in FIG. 4A is thinner than the thickness T4 of the second work function layer 319 of the second type memory cell 320.

Figure 8:
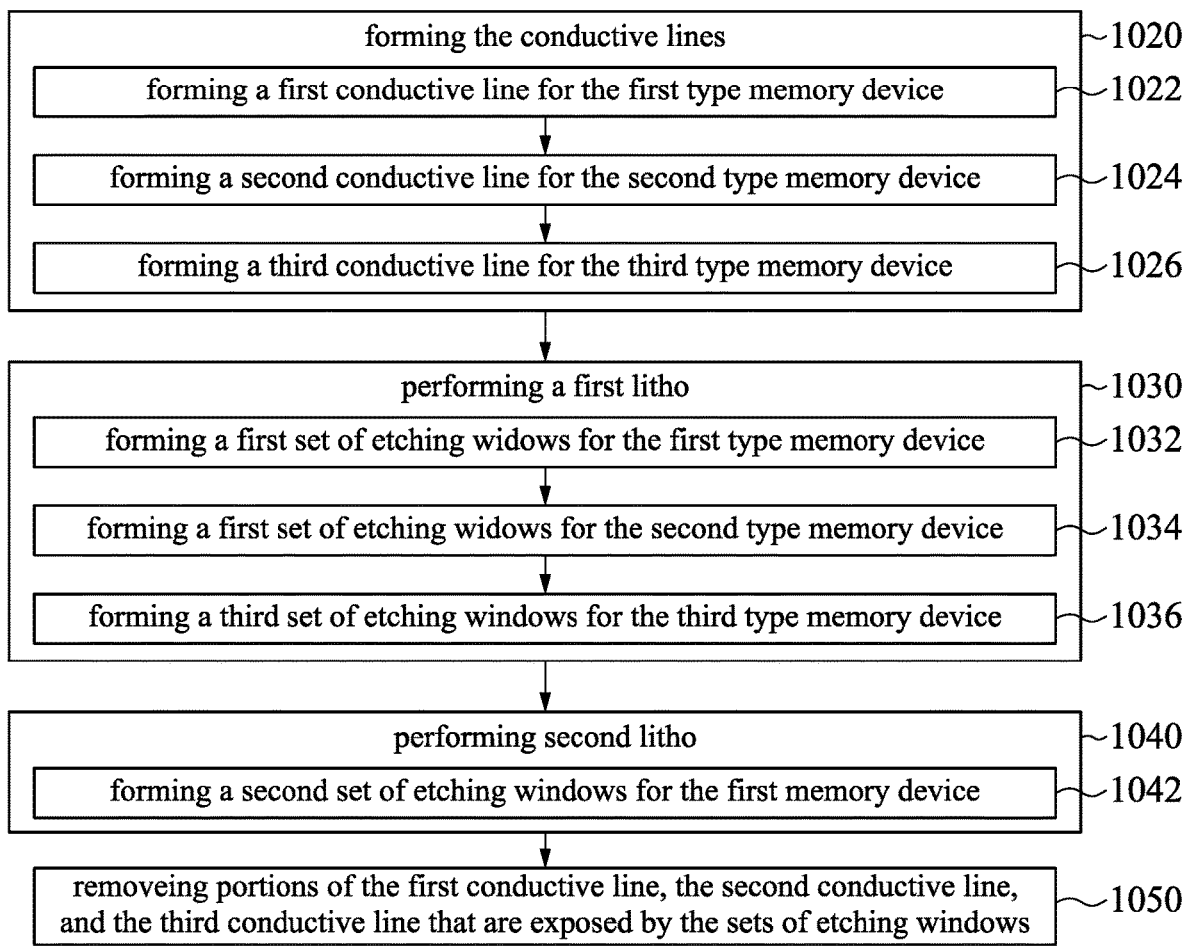
FIG. 8 is a flowchart of a method of forming an IC chip in accordance with some embodiments.

FIG. 8 is a flowchart of a method 1010 of forming an IC chip 100 in accordance with some embodiments. It is understood that additional operations may be performed before, during, and/or after the method 1010 depicted in FIG. 8, and that some other processes may be briefly described herein.

The method 1010 proceeds to operation 1020, where conductive lines at a first metal layer of the chip are formed based on conductive line layout patterns. For example, operation 1020 includes operation 1022, where conductive lines for first type memory cells of the first memory device 110 are formed based on conductive line layout patterns. Operation 1020 further includes operation 1024, where conductive lines for second type memory cells of the second memory devices 140 and 144 are formed based on conductive line layout patterns.

Method 1010 proceeds to operation 1030, where a first lithographic process is performed to form a first set of etching windows in a mask layer based on a first set of cutting layout patterns. For example, two etching windows in mask layer are formed based on cutting layout patterns. Operation 1030 includes forming the mask layer for the first type memory cells 220 of first memory device in operation, forming the mask layer for the second type memory cells 320 of the second memory devices 140 and 144, and forming the mask layer for the third type memory cells 420 of the third memory devices 160.

Method 1010 proceeds to operation 1040, where a second lithographic process is performed to form a second set of etching windows in the mask layer based on a second set of cutting layout patterns. For example, two other etching windows in mask layer are formed based on cutting layout patterns. Operation 1040 includes forming the mask layer for the first type memory cells 220 of the first memory device 110 in operation 1042. In some embodiments, operation 1034 is performed as part of operation 1040 and is not part of operation 1030.

Method 1010 proceeds to operation 1050, where portions of the conductive lines that are exposed by the etching windows in the mask layer are removed. A plurality of landing pads are formed as a result of trimming the conductive lines based on operations 1030-1050.

According to some embodiments, the integrated circuit chip provides a reasonable channel width with small area and allow channel length for continuing shrink. From a cell size point of view, the single fin transistors for the memory devices are a good option for designing a high-density SRAM cell. Further, the design for the single fin transistor on the SRAM cell also improves cell standby leakage due to less width. Furthermore, the arrangement of the memory devices may have both high density and high speed cell offering for the case of the chip dimension reduction. Specifically, the first type memory cell provides a function of high-density/low standby, and the second type memory cell provides another function of high-density/high speed in one chip.

According to some embodiments, a method of manufacturing an integrated circuit chip includes doping a substrate with a p-type dopant to form a first p-well region in a first memory cell and a second p-well region in a second memory cell; forming first and second semiconductor fins over the first and second p-well regions, respectively; forming a first work function layer over the first semiconductor fin; forming a second work function layer over the second semiconductor fin and having a thickness different from a thickness of the first work function layer; and forming a metal fill layer over the first and second work function layers.

According to some embodiments, a method of manufacturing an integrated circuit chip includes doping a substrate with a n-type dopant to form a first n-well region in a first memory cell and a second n-well region in a second memory cell; forming first and second semiconductor fins over the first and second n-well regions, respectively; forming a first work function layer over the first semiconductor fin; forming a second work function layer over the second semiconductor fin and having a thickness different from a thickness of the first work function layer; and forming a metal fill layer over the first and second work function layers.

According to some embodiments, a method of manufacturing an integrated circuit chip includes doping a substrate with a p-type dopant to form a first p-well region in a first memory cell and a second p-well region in a second memory cell; forming first and second semiconductor fins over the first and second p-well regions, respectively; forming a first work function layer over the first semiconductor fin; forming a second work function layer over the second semiconductor fin and having a material different from that of the first work function layer; and forming a metal fill layer over the first and second work function layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit chip, comprising:
doping a substrate with a p-type dopant to form a first p-well region in a first memory cell and a second p-well region in a second memory cell;
forming first and second semiconductor fins over the first and second p-well regions, respectively;

forming a first work function layer over the first semiconductor fin and being of a pull down device in the first memory cell;

forming a second work function layer over the second semiconductor fin, being of a pull down device in the second memory cell, and having a thickness different from a thickness of the first work function layer; and forming a metal fill layer over the first and second work function layers.

2. The method of claim 1, wherein forming the first and second work function layers is performed such that a material of the first work function layer is substantially the same as a material of the second work function layer.

3. The method of claim 1, wherein forming the first and second work function layers is performed such that a material of the first work function layer is different from a material of the second work function layer.

4. The method of claim 1, wherein the first work function layer includes TiN.

5. The method of claim 1, wherein the first work function layer includes TiAl.

6. The method of claim 1, further comprising forming a barrier layer over the first semiconductor fin prior to forming the first work function layer.

7. The method of claim 1, further comprising forming a barrier layer over the second semiconductor fin prior to forming the second work function layer.

8. The method of claim 1, further comprising:
forming a third work function layer over the first work function layer prior to forming the metal fill layer.

9. The method of claim 8, further comprising:
forming a fourth work function layer over the second work function layer prior to forming the metal fill layer, such that a thickness of the fourth work function layer is substantially the same as a thickness of the third work function layer.

10. A method of manufacturing an integrated circuit chip, comprising:
doping a substrate with a n-type dopant to form a first n-well region in a first memory cell and a second n-well region in a second memory cell;
forming first and second semiconductor fins over the first and second n-well regions, respectively;
forming a first work function layer over the first semiconductor fin and being of a pull up device in the first memory cell;
forming a second work function layer over the second semiconductor fin, being of a pull down device in the second memory cell, and having a thickness different from a thickness of the first work function layer; and
forming a metal fill layer over the first and second work function layers.

11. The method of claim 10, wherein forming the first and second work function layers is performed such that a material of the first work function layer is substantially the same as a material of the second work function layer.

12. The method of claim 10, further comprising:
doping the substrate with a p-type dopant to form a p-well region in the first memory cell;
forming a third semiconductor fin over the p-well region; and
forming a third work function layer over the third semiconductor fin such that a thickness of the third work function layer is different from the thickness of the first work function layer.

13. The method of claim 12, wherein a material of the third work function layer is substantially the same as a material of the first work function layer.

14. The method of claim 12, wherein the third work function layer is in contact with the first work function layer.

15. The method of claim 12, further comprising:
forming a fourth work function layer over the first and third work function layers, wherein a thickness of a portion of the fourth work function layer above the first semiconductor fin is substantially the same as a thickness of another portion of the fourth work function layer above the third semiconductor fin.

16. A method of manufacturing an integrated circuit chip, comprising:
doping a substrate with a p-type dopant to form a first p-well region in a first memory cell and a second p-well region in a second memory cell;
forming first and second semiconductor fins over the first and second p-well regions, respectively;
forming a first work function layer over the first semiconductor fin;
forming a second work function layer over the second semiconductor fin and having a material different from that of the first work function layer;
forming a third work function layer over the first work function layer; and
after forming the third work function layer, forming a metal fill layer over the first and second work function layers.

17. The method of claim 16, wherein forming the first and second work function layers is performed such that a thickness of the first work function layer is different from a thickness of the second work function layer.

18. The method of claim 16, wherein the first work function layer is of a pull down device in the first memory cell and the second work function layer is of a pull down device in the second memory cell.

19. The method of claim 16, wherein the first work function layer comprises TiN.

20. The method of claim 16, further comprising forming a barrier layer over the first semiconductor fin prior to forming the first work function layer.

* * * * *